(12) United States Patent
Koriyama et al.

(10) Patent No.: US 6,501,352 B1
(45) Date of Patent: Dec. 31, 2002

(54) HIGH FREQUENCY WIRING BOARD AND ITS CONNECTING STRUCTURE

(75) Inventors: Shinichi Koriyama, Kagoshima (JP); Kenji Kitazawa, Kagoshima (JP); Hidehiro Minamiue, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 13 days.

(21) Appl. No.: 09/636,054

(22) Filed: Aug. 10, 2000

(30) Foreign Application Priority Data

| Aug. 11, 1999 | (JP) | ............................................. | 11-227959 |
| Aug. 11, 1999 | (JP) | ............................................. | 11-227960 |
| Aug. 11, 1999 | (JP) | ............................................. | 11-227961 |
| Aug. 31, 1999 | (JP) | ............................................. | 11-245345 |

(51) Int. Cl.$^7$ ................................................ H01P 1/00
(52) U.S. Cl. ...................................... 333/260; 333/238
(58) Field of Search ................................ 333/238, 246, 333/247, 260

(56) References Cited

U.S. PATENT DOCUMENTS

| 4,543,544 | A | * | 9/1985 | Ziegner | ........................ 333/34 |
| 4,626,805 | A | | 12/1986 | Jones | ........................ 333/33 |
| 4,801,905 | A | * | 1/1989 | Becker | ........................ 333/238 |
| 4,906,953 | A | * | 3/1990 | Li et al. | ........................ 333/33 |
| 5,428,327 | A | * | 6/1995 | Bahl | ........................ 333/246 |

FOREIGN PATENT DOCUMENTS

| EP | 0-883328 | 12/1998 |
| WO | 98/53518 | 11/1998 |

* cited by examiner

*Primary Examiner*—Robert Pascal
*Assistant Examiner*—Joseph Chang
(74) *Attorney, Agent, or Firm*—Hogan & Hartson LLP

(57) ABSTRACT

A high frequency wiring board having a high frequency transmission line having a signal conductor line formed on the surface of a dielectric board and a grounding layer formed inside or on the reverse surface of the dielectric board parallel to the signal conductor line, and a connecting terminal portion provided at a terminal end of the high frequency transmission line and including connecting grounding conductors formed with spacing on both sides of the signal conductor line and through conductors for connecting the connecting grounding and the grounding layer. The distance between the through conductors and an end side surface of the dielectric board is not more than 0.3 times the signal wavelength, in the dielectric board, of a high frequency signal.

27 Claims, 17 Drawing Sheets

HIGH FREQUENCY WIRING BOARD AND ITS CONNECTING STRUCTURE

BACKGROUND OF THE INVENTION

1. Field of the Invention

The present invention relates generally to a high frequency wiring board provided with a high frequency transmission line having a signal conductor line and a grounding layer formed parallel to the signal conductor line through a dialectic board, and its connecting structure. More particularly, the present invention relates to a high frequency wiring board suitable for a semiconductor device containing package, a multi-layer wiring board, or the like which carries a high frequency semiconductor device in a millimeter wave region having a frequency of not less than 30 GHz (and further, not less than 50 GHz) and its connecting structure.

2. Description of Related Art

As radio waves used for information transmission, radio waves in a microwave region having a frequency of 1 to 30 GHz have been conventionally used. In recent years, we have entered upon the sophisticated information year. Therefore, we have examined the use of a millimeter wave region having a frequency of 30 to 300 GHz. For example, application systems using radio waves in a millimeter wave region, for example, a high speed radio data communication system (radio LAN (Local Area Network)) in an office have been also proposed.

As a wiring board such as a package containing or carrying a high frequency semiconductor device (hereinafter merely referred to as a high frequency device) used for such application systems, a so-called metal package has been conventionally used. The metal package has a structure in which a connecting board made of ceramics is joined to a metal frame in order to minimize the transmission loss of a high frequency signal.

FIG. 16A is a plan view showing a mounting structure in which a high frequency device is contained in a conventional metal package and is mounted on an external circuit board, and FIG. 16B is a cross-sectional view of the mounting structure. In FIG. 16A, a cover is omitted.

A metal package 33 comprises a metal board 31 and a cover 32. A connecting board 36 in which a signal conductor line 35 is formed on a ceramic board 34 is mounted on a part of the metal package 33. The signal conductor line 35 is electrically connected to a high frequency device 37 (indicated by hatching) carried in the metal package 33 by a ribbon or the like.

The metal package 33 is fixed to the surface of a base board 38 (indicated by hatching) by screws 39 or the like. A circuit board 42 in which a signal conductor line 41 is formed on the surface of a dielectric board 40 is provided on the surface of the base board 38. The signal conductor line 41 is electrically connected to the signal conductor line 35 in the connecting board 36 by a ribbon, a wire, or the like.

The assembly of such a metal package is complicated. Accordingly, there have been difficulties in mass production cost reduction at the time of fabricating a module have been a problem.

In order to solve this problem, it has been proposed that a signal conductor line is pulled out to the reverse surface of the package using a through hole conductor or the like from the inside of the dielectric board. That is, a connecting terminal portion is formed at a terminal end of the signal conductor line in the form of a through hole. The package is soldered to and surface-mounted on a high frequency circuit formed on the surface of another dielectric board by soldering reflow.

FIGS. 17, 18A, 18B, and 18C are illustrations for explaining the structure of a high frequency package using such a through hole conductor. As illustrated in the schematic cross-sectional view of FIG. 17, a dielectric board 51 and a cover 52 form a cavity in a high frequency package 50, and a high frequency device 53 is contained in the cavity. A signal conductor line 54 having its one end connected to the high frequency device 53 by a ribbon or the like is formed on the surface of the dielectric board 51. A grounding layer 55 (indicated by hatching) having a pattern shown in FIG. 18A is formed inside the dielectric board 51.

The other end of the signal conductor line 54 is connected to a through hole conductor 56 formed upon penetrating the dielectric board 51 so as not to come into contact with the grounding layer 55. The through hole conductor 56 is connected to a signal conductor line 57 formed on the reverse surface of the dielectric board 51. Consequently, the signal conductor line 54 is electrically connected to the signal conductor line 57 through the through hole conductor 56.

A pair of connecting grounding conductors 58 (indicated by hatching) is provided with spacing on both sides of an end of the signal conductor line 57 (indicated by hatching), as shown in FIG. 18B, on the reverse surface of the dielectric board 51. The grounding conductors 58 are electrically connected to the grounding layer 55 inside the dielectric board 51, respectively, by viahole conductors 59.

It is considered that when the viahole conductors 59 are formed near an end side surface a50 of the dielectric board 51, a portion between the viahole conductor 59 and the dielectric board 51 is liable to be cracked, for example. Generally, the viahole conductor 59 is formed at a position spaced not less than 2 mm apart from the end side surface a50 of the dielectric board 51 from the viewpoint of processability of a viahole by a micro-drill or the like.

The spacing between the viahole conductor 59 and the signal conductor line 57 is generally set to not less than 1 mm such that solders are not brought into contact with each other and short-circuited by making connection using the solders. That is, the spacing is approximately 0.5 times the signal wavelength of a high frequency signal in the dielectric board 51 composed of alumina (having a dielectric constant of 8.9) ceramics, for example, when a high frequency signal having a frequency of 50 GHz is transmitted. In this construction, however, the transmission loss of the high frequency signal is large from the following reasons, and the signal cannot, in some cases, be transmitted.

In the above-mentioned construction, a connecting terminal portion is constituted by the dielectric board 51, the signal conductor line 57, the grounding layer 55, the pair of connecting grounding conductors 58, and the viahole conductor 59. The connecting terminal portion is generally designed such that the impedance, in a cross section perpendicular to the direction of signal transmission, of the connecting terminal portion coincides with the impedance, in a cross section perpendicular to the direction of signal transmission, of a high frequency transmission line in order to diminish the reflection of the high frequency signal from the high frequency transmission line. In this case, however, the transmission loss of the high frequency signal is large from the following reasons, and the signal cannot, in some cases, be transmitted.

On the other hand, a grounding layer 61 is formed, as shown in FIG. 17, inside an external circuit board 60 on which the package 50 is mounted. A signal conductor line 62 (indicated by hatching) is formed, as shown in FIG. 18C, on the surface of the external circuit board 60. In a connecting portion with the package 50, connecting grounding conductors 63 (indicated by hatching) are formed with spacing on both sides of the signal conductor line 62. The connecting grounding conductors 63 are electrically connected to each other by a grounding layer 61 and viahole conductors 64.

The package 50 is mounted on the surface of the external circuit board 60 by electrically connecting the signal conductor lines 57 and 62 and electrically connecting the connecting grounding conductors 58 and 63, respectively, using solders 65 such as solder.

The package 50 can be thus collectively connected mechanically and electrically to the external circuit board 60 by reflow or the like. Consequently, the package 50 is more advantageous in that it is possible to improve quantity production and lower cost at the time of module fabrication, as compared with the metal package 33 shown in FIGS. 16A and 16B.

In the structure of the package 50 shown in FIG. 17, however, high frequency signal transmission characteristics in the connection terminal portion comprising the signal conductor line 57 formed on the reverse surface of the dielectric board 51 and the pair of connecting grounding conductors 58 formed on both sides thereof are not necessarily sufficient. That is, the connecting terminal portion has good transmission characteristics when the signal to be transmitted is a microwave signal having a frequency of less than 30 GHz (particularly not more than 3 GHz). When the frequency of the signal to be transmitted is very high, that is, not less than 30 GHz (particularly, not less than 50 GHz) in a millimeter wave region, however, it is difficult to transmit the signal between the package and the external circuit board. That is, in a mounting structure in which the package 50 is mounted on the external circuit board, the transmission loss of the high frequency signal to e transmitted therebetween is large. The transmission itself of the signal may, in some cases, be difficult.

Various considerations of the cause prove that the transmission characteristics are degraded because resonance occurs between the viahole conductors 59 and the end side surface a50 of the dielectric board 51. When the signal frequency is low, no resonance occurs because the signal wavelength is large. Contrary to this, as the frequency increases, and the signal wavelength decreases, resonance may easily occur.

A grounding current playing a part in signal transmission in a high frequency wiring board flows with the grounding current concentrated on the grounding layer just below the signal conductor line. In the connecting terminal portion on the package 50, a signal current in the signal conductor line 57 directly flows through the signal conductor line 62 on the external circuit board 60 via the solder 65 such as solder. Contrary to this, the grounding current flowing through the grounding layer 55 in the package 50 branches into the pair of viahole conductors 59 in the connecting terminal portion, and is introduced into the grounding layer 61 via the solder 65 and the viahole conductors 64 on the external circuit board 60, to reach a portion just below the signal conductor line 62 in the external circuit board 60. Therefore, the path length of the grounding current is larger than the path length of the signal current.

In a case where the difference in the path length is 1 mm, for example, when the frequency of the signal is not more than 50 GHz, for example, 3 GHz, the difference in the path length is not more than 0.033 times the wavelength of the signal in alumina ceramics. Accordingly, there is little phase difference between the signal conductor line and the grounding layer. Contrary to this, when the signal is a high frequency signal having a frequency of not less than 50 GHz, the difference in the path length cannot be ignored with respect to the wavelength of the signal. That is, a large phase difference occurs between the signal conductor line and the grounding layer. The signal is reflected by the phase difference, increasing the transmission loss of the signal.

Furthermore, as the frequency of the signal which is transmitted through the high frequency transmission line greatly increases to not less than 30 GHz, for example, the wavelength thereof decreases. Therefore, a quarter-wavelength representing sensitivity to a structural change of the high frequency signal approximates to the size of a constituent element of the high frequency transmission line, for example, the thickness of the dielectric board. In the connecting portion having a surface mounting structure shown in FIGS. 17, 18A to 18C, therefore, coupling between the signal conductor line on the package 50 and the ground occurs between the signal conductor line and not only the ground portion having a cross section, perpendicular to the signal transmission direction of the connecting portion but also the grounding layer 55 in the high frequency transmission line and the grounding layer 61 in the external circuit board 60. Consequently, the actual three-dimensional impedance of the connecting portion is smaller than the two-dimensional impedance, in a cross section perpendicular to the direction of signal transmission, of the connecting portion.

In other words, in a portion where the structure of the high frequency transmission line is changed, for example, the connecting portion having a surface mounting structure, when the signal frequency increases, a stray capacitance is created. When the impedance, in the cross section perpendicular to the direction of signal transmission, of the connecting portion is matched with the impedance of the high frequency transmission line in accordance with the conventional idea, the actual impedance of the connecting portion for the high frequency signal is smaller than the impedance of the high frequency transmission line. The signal is reflected by the impedance mismatching, increasing the transmission loss of the signal.

SUMMARY OF THE INVENTION

An object of the present invention is to provide a high frequency wiring board having a dielectric board provided with a high frequency transmission line comprised of a signal conductor line and a grounding layer, the high frequency wiring board being capable of reducing, when connected to another high frequency circuit, the transmission loss of a high frequency signal in a connecting portion and a connecting structure of such high frequency wiring board.

A high frequency wiring board according to the present invention comprises a dielectric board; a high frequency transmission line, having a signal conductor line formed on the surface of the dielectric board and having its terminal end extending toward the vicinity of an end side surface of the dielectric board and a grounding layer formed inside or on the reverse surface of the dielectric board parallel to the signal conductor line, for transmitting a high frequency signal; and a connecting terminal portion of a transmission loss reducing structure, provided at a terminal end of the high frequency transmission line, in order to make connection with another high frequency circuit, the connecting terminal portion including connecting grounding conductors formed with spacing on both sides of the signal conductor line on the surface of the dielectric board and through conductors provided upon penetrating the dielectric board for connecting the connecting grounding conductors and the grounding layer.

It is preferable that the distance between the through conductors and the end side surface of the dielectric board is not more than 0.3 times the signal wavelength, in the dielectric board, of the high frequency signal.

By this construction, it is possible to prevent resonance from occurring between the through conductors and the end side surface of the dielectric board. As a result, the loss of the high frequency signal in the entire connecting portion with the other external circuit is reduced, thereby making it possible to satisfactorily transmit the high frequency signal.

In the present invention, the connecting terminal portion on the wiring board is constituted by a coplanar line having a pair of connecting grounding conductors formed on both sides of the signal conductor line. Therefore, the connection with the other external circuit can be achieved by connecting the coplanar lines. This also allows the reflection of the high frequency signal to be diminished.

It is preferable that the distance between the through conductors and the end side surface of the dielectric board is not less than 0.05 mm.

A side surface of the through conductor may be exposed from the end side surface of the dielectric board. By this construction, a dielectric is not interposed between the through conductors and the end side surface of the dielectric board. Accordingly, it is possible to prevent resonance from occurring between the through conductors and the end side surface of the dielectric board. As a result, the loss of the high frequency signal in the entire connecting portion with the other external circuit is reduced, thereby making it possible to satisfactorily transmit the high frequency signal.

The high frequency transmission line may be one through which a high frequency signal having a frequency of not less than 30 GHz is transmitted.

It is preferable that the line width, in the connecting terminal portion, of the signal conductor line is smaller than the line width, in the high frequency transmission line, of the signal conductor line. Consequently, it is possible to weaken coupling between the signal conductor line and the grounding layer to relatively strengthen coupling between the signal conductor line and the connecting grounding conductors. That is, it is possible to convert an electromagnetic field distribution in the connecting terminal portion into a distribution closer to an electromagnetic field in the coplanar line, thereby making it possible to diminish the reflection of the signal by the change in the electromagnetic field distribution.

From the same reason, it is preferable that the grounding layer positioned between at least the pairs of through conductors in the connecting terminal portion on the high frequency wiring board and facing to the signal conductor line is taken as a non-grounding region. Consequently, it is possible to convert an electromagnetic field distribution in the connecting terminal portion into a distribution closer to an electromagnetic field in the coplanar line, thereby making it possible to diminish the reflection of the signal. This is effective in making it possible to transmit the high frequency signal with low loss.

The connecting terminal portion may be connected to the other high frequency circuit by a solder.

It is preferable that the distance between the center of the signal conductor line and the through conductors is not more than 0.25 $\lambda g$ (particularly, not more than 0.15 $\lambda g$) ($\lambda g$: the signal wavelength, in the dielectric board, of the high frequency signal). In this case, the high frequency transmission line may be one through which a high frequency signal having a frequency of not less than 50 GHz is transmitted.

By this construction, in a case where the high frequency signal having a frequency of not less than 50 GHz is transmitted, a grounding current in the grounding layer just below the signal conductor line playing a part in the transmission of the high frequency signal is transmitted to the connecting grounding conductor with a small phase difference from a current in the signal conductor line. Therefore, the reflection of the high frequency signal in the connecting terminal portion is diminished, thereby making it possible to satisfactorily transmit the high frequency signal. As a result, the phase difference in a connecting portion with the other high frequency circuit is reduced, and the reflection of the high frequency signal in the entire connecting portion with the other external circuit is diminished, thereby making it possible to satisfactorily transmit the high frequency signal.

The through conductor may be a viahole conductor formed by filling a viahole formed upon penetrating the dielectric board with metal paste and sintering the metal paste.

It is preferable, from a view point to increase the reliability of the through conductor, that the maximum diameter of a cross section of the through conductor is not more than 0.5 mm.

It is preferable that letting Z1 be the impedance of the connecting terminal portion, and letting Z0 be the impedance of the high frequency transmission line, a relationship of 1.4 Z0≦Z1≦1.8 Z0 is satisfied. In this case, letting W1 be the line width, in the connecting terminal portion, of the signal conductor line, and letting W0 be the line width, in the high frequency transmission line, of the signal conductor line, a relationship of 0.4 W0≦W1≦0.8 W0 is satisfied.

By this construction, even when the signal having a frequency of not less than 30 GHz is transmitted, the actual impedance of the connecting portion for the high frequency signal and the impedance of the high frequency transmission line can be matched with each other. Consequently, it is possible to reduce the transmission loss of the high frequency signal in the connecting portion with the external circuit.

A connecting structure of the high frequency wiring board according to the present invention is obtained by connecting the first high frequency wiring board and the second high frequency wiring board at least one of which has (preferably both of which have) the above-mentioned characteristics, wherein the respective signal conductor lines and the respective pairs of connecting grounding conductors in the connecting terminal portions on the first and second high frequency wiring boards are respectively connected to each other through solders. It is preferable that the respective connecting terminal portions on the first and second high frequency wiring boards have the same structural features.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
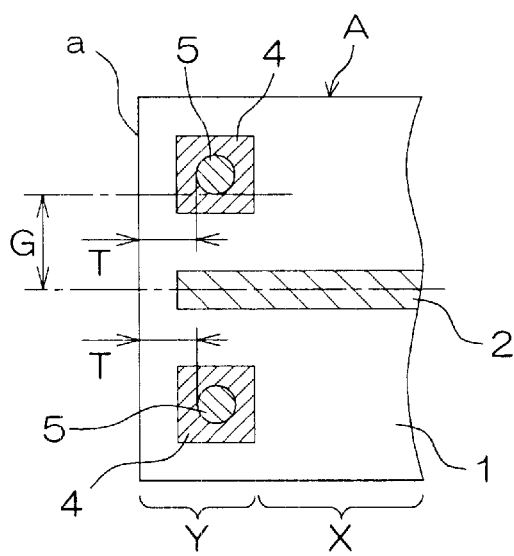
FIG. 1A is a plan view, in the vicinity of a connecting terminal portion, of a high frequency wiring board according to a first embodiment of the present invention.
Figure 1B:
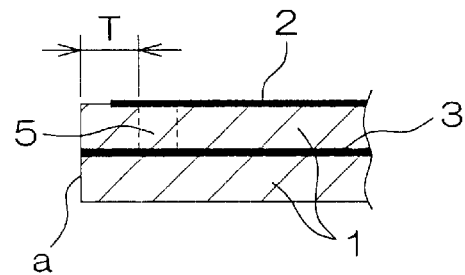
FIG. 1B is a schematic cross-sectional view thereof.

FIG. 1A is a plan view, in the vicinity of a connecting terminal portion, of a high frequency wiring board according to a first embodiment of the present invention, and FIG. 1B is a schematic cross-sectional view thereof. A wiring board A comprises a dielectric board 1 and a signal conductor line 2 (indicated by hatching) formed on the surface of the dielectric board 1. A grounding layer 3 is formed parallel to the signal conductor line 2 inside the dielectric board 1. The signal conductor line 2 and the grounding layer 3 form a high frequency transmission line X having a microstrip line structure. A connecting terminal portion Y for connection with an external circuit is formed at a terminal end of the high frequency transmission line X.

The dielectric board 1 is composed of a dielectric material, for example, ceramics such as alumina ceramics, mullite ceramics, aluminium nitride ceramics, silicon nitride ceramics, silicon carbide ceramics, and glass ceramics and organic resins such as epoxy resin and fluororesin. The dielectric constant of the dielectric material is preferably in a range of 2 to 15, and more preferably in a range of 4 to 12.

In the connecting terminal portion Y, a pair of connecting grounding conductors 4 (indicated by hatching) in the shape of a polygon such as a circle, a triangle, or a square is provided with spacing on both sides of a terminal end of the signal conductor line 2 on the surface of the dielectric board 1. The connecting grounding conductors 4 are electrically connected to the grounding layer 3, respectively, through through conductors 5 (indicated by hatching) such as viahole conductors, castellations, or open holes.

The distance T between the through conductor 5 and an end side surface a of the dielectric board is not less than 0.05 mm and particularly, not less than 0.08 mm, that is, not more than 0.3 times and particularly, not more than 0.2 times the signal wavelength, in the dielectric board, of a high frequency signal.

When the distance T is larger than 0.3 times the signal wavelength, in the dielectric board, of the high frequency signal, resonance occurs between the through conductor 5 and the end side surface a of the dielectric board, resulting in extremely degraded signal transmission characteristics.

When the distance T is less than 0.05 mm, strength between the through conductor 5 and the end side surface a of the dielectric board 1 is decreased, thereby making it difficult to increase the precision of the through conductor 5. Further, a portion between the through conductor 5 and the end side surface a of the dielectric board 1 is liable to be cracked, for example, due to the difference in thermal expansion, for example, between a conductor in the through conductor 5 and the dielectric board 1, resulting in decreased long-term reliability.

The shape of a cross section of the through conductor 5 is not particularly limited. For example, it may be a shape such as a circle or an ellipse. In increasing processability in a case where the through conductor 5 is formed in the vicinity of the end side surface a of the dielectric board 1, however, it is desirable that the maximum diameter of the cross section is not more than 0.5 mm and particularly, not more than 0.3 mm, and further, not more than 0.2 mm.

On the other hand, in the connecting terminal portion Y, the respective distances G between the center of the signal conductor line 2 and the through conductors 5 are decreased to not more than 0.25 λg and particularly, not more than 0.15 λg (λg: the signal wavelength, in the dielectric board, of the high frequency signal). Consequently, the distance between the through conductors 5 is 2G, i.e., not more than 0.5 λg and particularly, not more than 0.3 λg.

When the wiring board A is surface-mounted on an external circuit board, therefore, a grounding current in the grounding layer 3 just below the signal conductor line 2 playing a part in the transmission of the high frequency signal in a connecting portion with the external circuit board is transmitted to the grounding conductors 4 with a small phase difference from a current in the signal conductor line 2 via the through conductors 5. Therefore, the reflection of the signal due to the phase difference is diminished, thereby making it possible to pass and transmit the high frequency signal having a frequency of not less than 30 GHz (particularly, not less than 50 GHz).

The distance G in the specification indicates the distance between the center of the line width at the terminal end of the signal conductor line 2 and a surface, on the side of the signal conductor line 2, of the through conductor 5.

It is preferable that letting Z1 be the impedance, in a cross section perpendicular to the direction of signal transmission, of the connecting terminal portion Y, and Z0 be the impedance, in a cross section perpendicular to the direction of signal transmission, of the high frequency transmission line X, a relationship of 1.4 Z0≦Z1≦1.8 Z0 and particularly, 1.6 Z0≦Z1≦1.7 Z0 is satisfied.

When the wiring board A is surface-mounted on an external circuit board or the like having another high frequency circuit, the actual impedance, for the high frequency signal, of the connecting portion with the external circuit board is matched with the impedance of the high frequency transmission line X. Therefore, the reflection of the signal due to impedance mismatching is diminished, thereby making it possible to pass and transmit the high frequency signal having a frequency of not less than 30 GHz.

The reason why the relationship between Z0 and Z1 is determined, as described above, is that in either one of cases where Z1<1.4 Z0 and Z1>1.8 Z0, it is difficult to achieve impedance matching.

Figure 2:
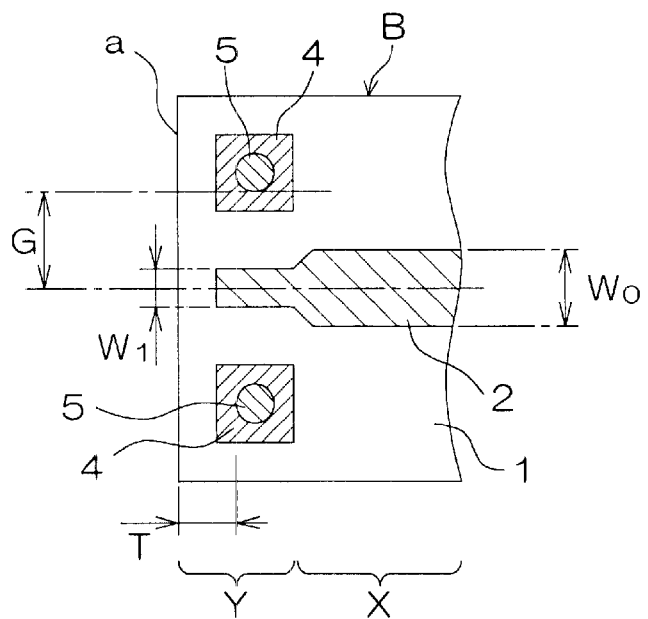
FIG. 2 is a plan view showing a preferable modified example of the wiring board shown in FIGS. 1A and 1B.

In order to satisfy the above-mentioned relationship between Z0 and Z1, it is preferable that a wiring board B in a shape shown in FIG. 2 is employed. On the wiring board B, the width, in a connecting terminal portion Y, of a signal conductor line 2 is smaller than the width, in a high frequency transmission line X, of the signal conductor line 2. Specifically, letting W0 be the width, in the high frequency transmission line X, of the signal conductor line 2, and letting W1 be the width, in the connecting terminal portion Y, of the signal conductor line 2, a relationship of 0.4 W0≦W1≦0.8 W0 is satisfied.

Consequently, a region on which an electromagnetic field generated by signal transmission inside the grounding layer 3 in the connecting terminal portion Y is concentrated is continuously transmitted to an external circuit board (another high frequency circuit) via through conductors 5, that is, coupling between the signal conductor line 2 and the grounding layer 3 is weakened in the connecting terminal portion Y. Accordingly, the impedance in the cross section of the high frequency transmission line X is increased. Consequently, it is possible to convert the distribution of the electromagnetic field into a distribution close to an electromagnetic field in a coplanar line from a distribution close to an electromagnetic field in a microstrip line. As a result, it is possible to diminish the reflection of the signal due to the change in the electromagnetic field distribution in the connecting portion.

It is preferable that a region Z (see FIGS. 3A to 3C) positioned between at least the paired through conductors 5 in the grounding layer 3 and facing to the signal conductor line 2, that is, a region Z where a line segment region connecting the paired through conductors 5 and the signal conductor line 2 are overlapped with each other, as viewed from the top, is taken as a non-grounding region 6 in the connecting terminal portion Y on the wiring board. This construction is also effective in diminishing the reflection of the signal.

Figure 3A:
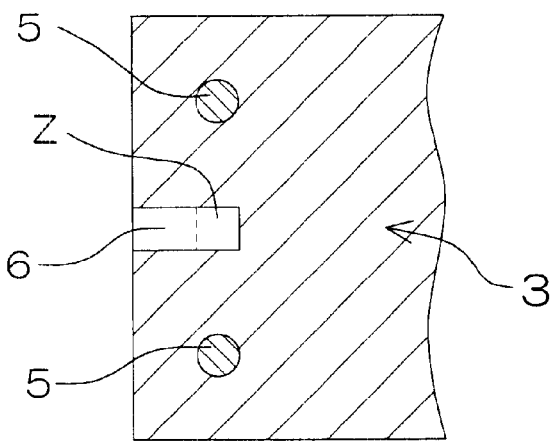
FIGS. 3A, 3B, and 3C are pattern diagrams of a grounding layer in the wiring board shown in FIGS. 1A and 1B.

The non-grounding region 6 may be any region, provided that it includes the region Z. That is, not only the region Z but also a region from the region Z to an end side surface of the grounding layer 3 (indicated by hatching), as shown in FIG. 3A, for example, may be taken as the non-grounding region 6. Consequently, the impedance in the cross section of the high frequency transmission line X can be increased, thereby making it possible to further reduce the transmission loss.

Figure 3B:
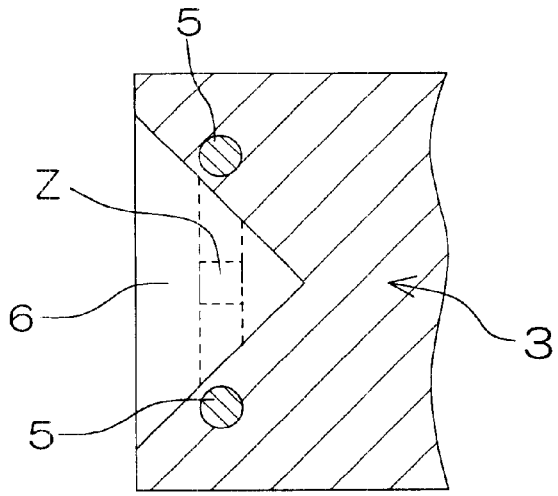

It is preferable that the non-grounding region 6 is formed in a shape including the region Z and continuously or gradually expanding toward the terminal end of the signal conductor line 2, as shown in FIG. 3B. By thus forming the non-grounding region 6 in an approximately V shape, it is possible to smooth the change in the electromagnetic field distribution from the high frequency transmission line X to the connecting terminal portion Y on the wiring board. Consequently, the reflection of the signal can be further diminished.

Figure 3C:
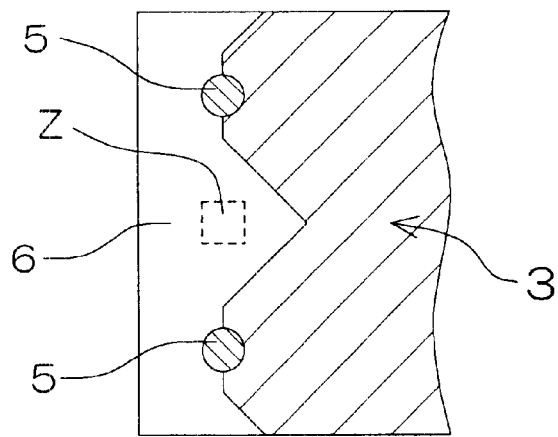

Furthermore, the non-grounding region 6 may be expanded to a region outside a region, interposed between the through conductors 5, in the grounding layer 3, as shown in FIG. 3C. That is, the non-grounding region 6 may be continuously or gradually expanded toward the terminal end of the signal conductor line 2 outside the through conductors 5. The non-grounding region 6 is thus formed in a so-called W-shape, thereby making it possible to further smooth the change in the electromagnetic field distribution. Consequently, the reflection of the signal can be diminished.

Figure 4:
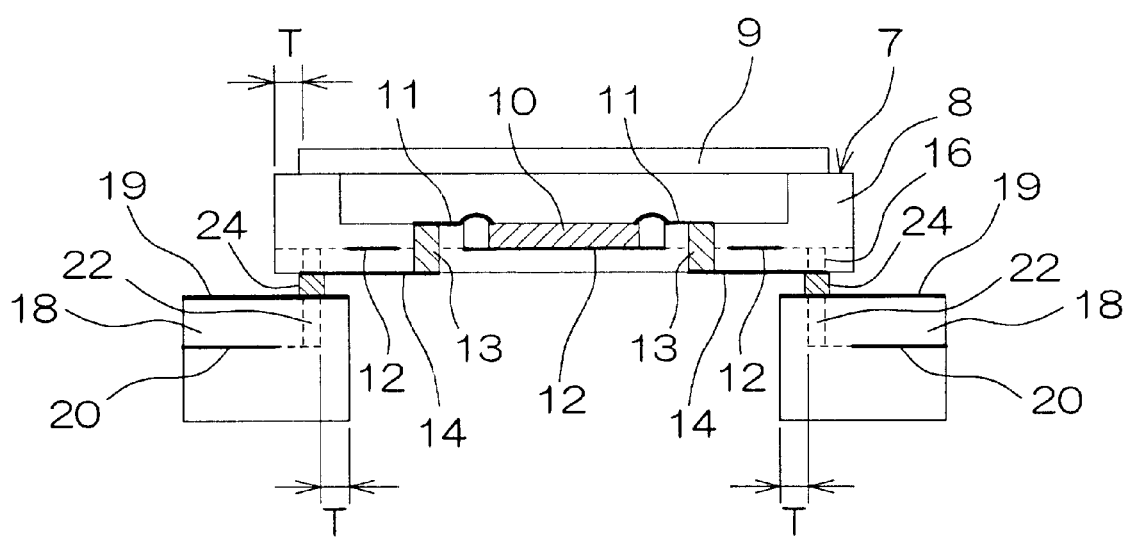
FIG. 4 is a schematic cross-sectional view for explaining an example of a connecting structure of the high frequency wiring board shown in FIG. 1A and 1B.

Referring now to FIG. 4, description is made of a connecting structure in a case where a package 7 carrying a high frequency device is mounted on an external circuit board having a high frequency circuit. In the package 7, a dielectric board 8 and a cover 9 form a cavity. A high frequency device is contained in the cavity.

Figure 5A:
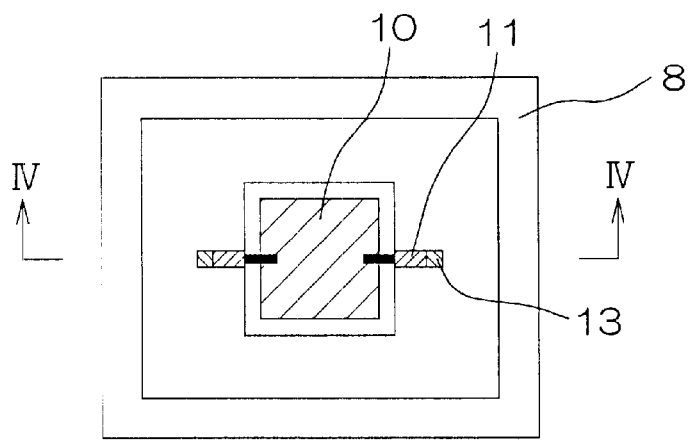
FIG. 5A is a plan view of a dielectric board in the high frequency wiring board shown in FIG. 4.

FIG. 5A is a plan view showing a state where the cover 9 is removed. Two signal conductor lines 11 for input and output each having its one end connected to the high frequency device 10 by a ribbon or the like are formed on a surface, on which the high frequency device 10 is carried, of the dielectric board 8.

Figure 5B:
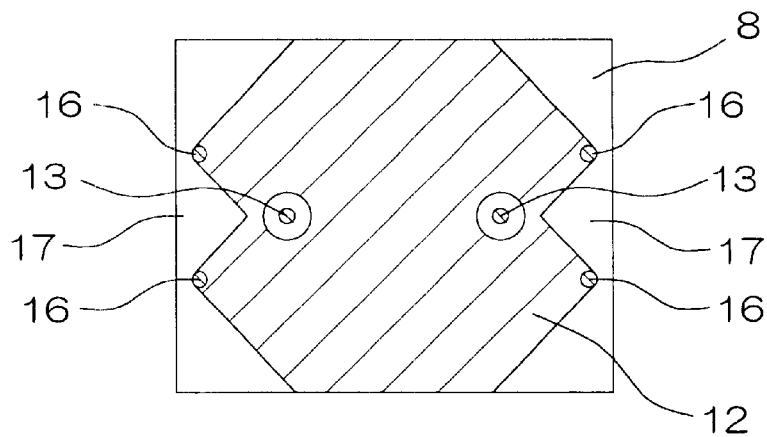
FIG. 5B is a pattern diagram of a grounding layer inside the dielectric board.

Inside the dielectric board 8, a grounding layer 12 (indicated by hatching) having its end in a W shape, as in the case shown in FIG. 3C, is embedded, as shown in a pattern diagram of FIG. 5B. The signal conductor line 11 and the grounding layer 12 form a high frequency transmission line having a microstrip line structure.

The other end, on the opposite side of the one end, connected to the high frequency device 10, of the signal conductor line 11 is connected to a through hole conductor 13. The through hole conductor 13 is formed so as not to come into contact with the grounding layer 12 upon penetrating the dielectric board 8, is led to the opposite surface of the dielectric board 8, and is connected to a signal conductor line 14 formed on the opposite surface of the dielectric board 8. Consequently, the signal conductor line 11 is electrically connected to the signal conductor line 14. The signal conductor line 14 and the grounding layer 12 form a high frequency transmission line X having a microstrip line structure.

Figure 5C:
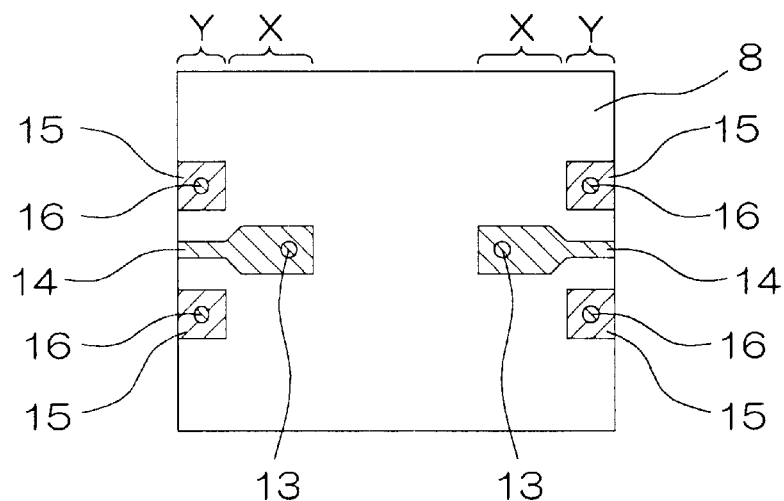
FIG. 5C is a plan view on the side of the reverse surface of the dielectric board.

On the reverse surface (the opposite surface) of the dielectric board 8, the two signal conductor lines 14 for input and output (indicated by hatching) are formed, as shown in a plan view (a pattern diagram) of FIG. 5C. A pair of connecting grounding conductors 15 (indicated by hatching) is provided with spacing on both sides of a terminal end of each of the signal conductor lines 14, thereby forming a connecting terminal portion Y. The connecting grounding conductors 15 are electrically connected to the grounding layer 12 inside the dielectric board 8, respectively, through the through conductors 16. The line width, in the connecting terminal portion Y, of the signal conductor line 14 is made smaller than the line width, in the high frequency transmission line X, of the signal conductor line 14.

In the package 7, the distance T between the through conductors 16 and the end side surface of the dielectric board 8 is not less than 0.05 mm, and not more than 0.3 times the signal wavelength, in the dielectric board, of the high frequency signal in the connecting terminal portion Y for connection to the high frequency wiring board, as described with reference to FIGS. 1A, 1B, 2, and 3A to 3C.

Furthermore, in the connecting terminal portion Y, the distance between the center of the signal conductor line 14 and the through conductors 16 is not more than 0.25 times the signal wavelength λg in the dielectric board.

Furthermore, the line width W1, in the connecting terminal portion Y, of the signal conductor line 14 is made smaller than the line width W0, in the high frequency transmission line X, of the signal conductor line 14 so as to satisfy the above-mentioned relationship. Consequently, the impedance Z1, in the cross section perpendicular to the direction of signal transmission, of the connecting terminal portion Y is set so as to satisfy a relationship of $1.4\ Z0 \leq Z1 \leq 1.8\ Z0$ with the impedance Z0, in the cross section perpendicular to the direction of the high frequency transmission line X.

On the other hand, an external circuit board 18 on which the package 7 is mounted has individual external circuit boards 181 and 182 for input and output.

Figure 6A:
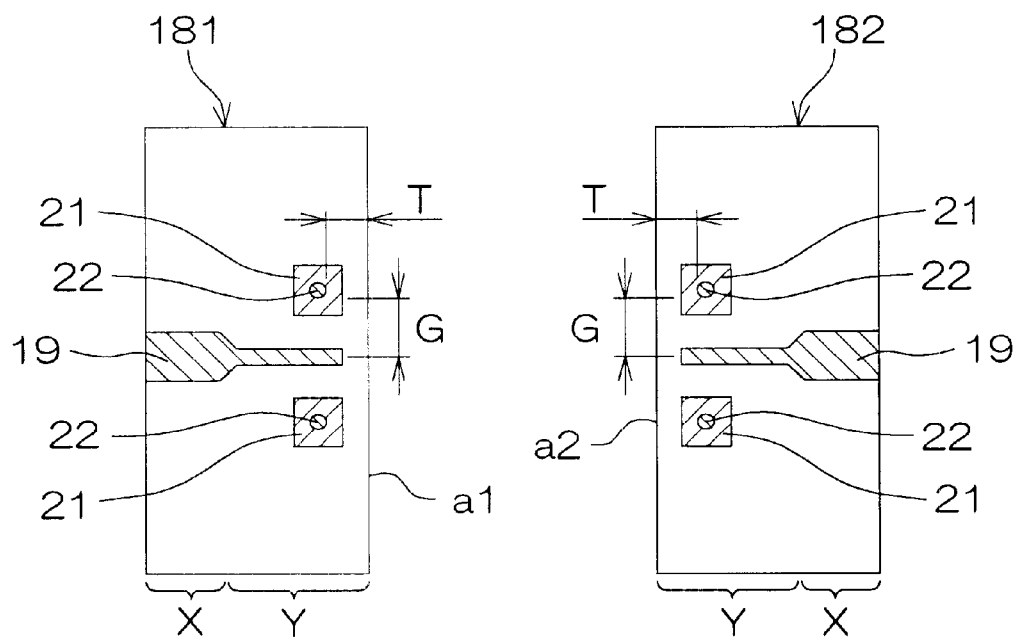
FIG. 6A is a plan view for explaining the structure of an external circuit board on which a package shown in FIG. 4 is mounted.

FIG. 6A is a plan view of the external circuit boards 181 and 182. Signal conductor lines 19 (indicated by hatching) for inputting and outputting a high frequency signal to and from the package 7 are respectively formed on the surfaces of the external circuit boards 181 and 182. Grounding layers 20 are respectively embedded in the external circuit boards 181 and 182. The grounding layer 20, together with a signal conductive line 19, forms a high frequency transmission line X composed of a microstrip line.

Connecting terminal portions Y are respectively formed at terminal ends of the signal conductor lines 19 for input and output. In the connecting terminal portion Y, a pair of connecting grounding conductors 21 (indicated by hatching) is formed with spacing, as in the case of the connecting terminal portion Y on the package 7, on both sides of each of the signal conductor lines 19. The connecting grounding conductors 21 are electrically connected to the grounding layer 20, respectively, through through conductors 22.

Figure 6B:
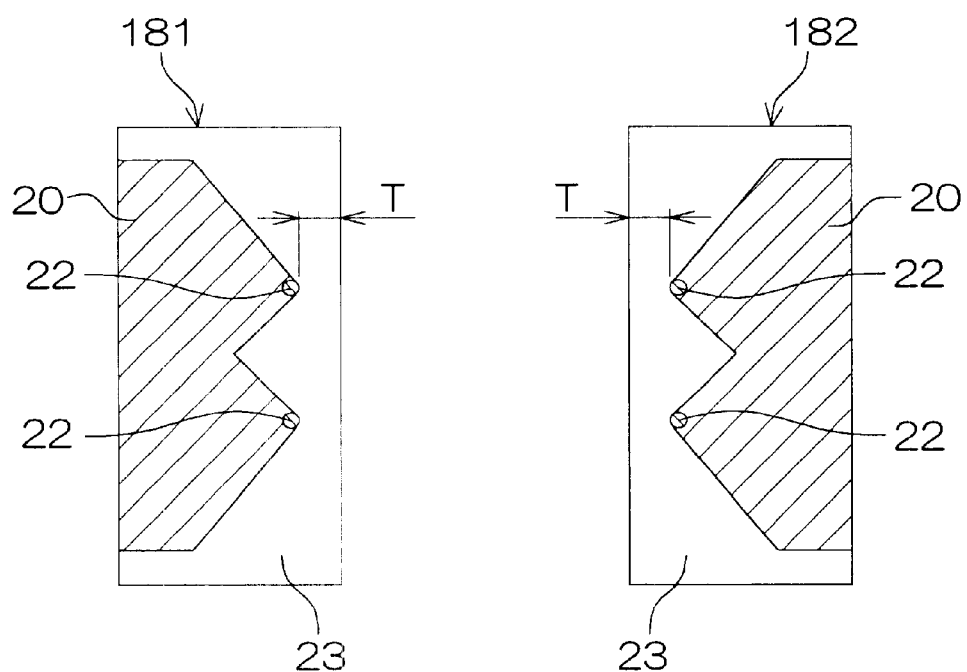
FIG. 6B is a pattern diagram of a grounding layer formed inside the external circuit board.

The grounding layer 20 has its end formed in a W shape in the connecting terminal portion Y, from the same reason as that in the case of the grounding layer 12 in the dielectric board 8 (see FIG. 5B) as indicated by hatching in FIG. 6B.

The structure of the connecting terminal portion Y on the external circuit board 18 is the same as that described with reference to FIGS. 1A, 1B, 2, and 3A to 3C. That is, the through conductors 22 are so arranged that the distance T from respective end side surfaces a1 and a2 of the external circuit boards 181 and 182 to the through conductors 22 is not less than 0.05 mm, and not more than 0.3 times the signal wavelength, in the dielectric board, of the high frequency signal.

The line width W1, in the connecting terminal portion Y, of the signal conductor line 19 is made smaller than the line width W0, in the other high frequency transmission line, of the signal conductor line 19. That is, the signal conductor line 19 is formed so as to satisfy a relationship of $0.4\ W0 \leq W1 \leq 0.8\ W0$.

Furthermore, the impedance Z1, in the cross section perpendicular to the direction of signal transmission, of the connecting terminal portion Y is set so as to satisfy a relationship of $1.4\ Z0 \leq Z1 \leq 1.8\ Z0$ with the impedance Z0, in the cross section perpendicular to the direction of signal transmission, of the high frequency transmission line X.

The through conductors 22 are provided at positions where the respective distances G from the center of the signal conductor line 19 to the through conductors are not more than 0.25 times the signal wavelength λg in the external circuit board 18.

The package 7 is surface-mounted on the external circuit board 18 (181, 182) by soldering reflow, after respectively abutting the signal conductor lines 14 and 19 and abutting the connecting grounding conductors 15 and 21, as shown in FIG. 4. That is, by solders 24, the signal conductor line 14 on the package 7 and the signal conductor line 19 on each of the external circuit boards 181 and 182 are electrically connected to each other, and the connecting grounding conductors 15 on the package 7 and the connecting grounding conductors 21 on each of the external circuit boards 181 and 182 are electrically connected to each other, respectively.

It is also possible to join and fix the signal conductors 14 and 19 and join and fix the connecting grounding conductors 15 and 21, respectively, by the solders via bumps or ball-shaped terminals having a higher melting point than that of the solders.

According to such a mounting structure, in connecting terminal portions for connection between the package 7 and the external circuit boards 181 and 182, it is possible to prevent resonance between the through conductors 16 and the end side surface a of the dielectric board 8 and resonance between the through conductors 22 and each of the end side surfaces a1 and a2 of the external circuit boards 181 and 182. Further, in the connecting terminal portions for connection between the package 7 and the external circuit boards 181 and 182, it is possible to restrain the reflection of the signal due to the above-mentioned impedance mismatching.

Furthermore, in the connecting terminal portions for connection between the package 7 and the external circuit boards 181 and 182, it is possible to restrain the reflection due to the above-mentioned phase difference. By the effects, there can be provided a connecting structure in which transmission loss between the package 7 and the external circuit boards 181 and 182 has been reduced.

Figure 7A:
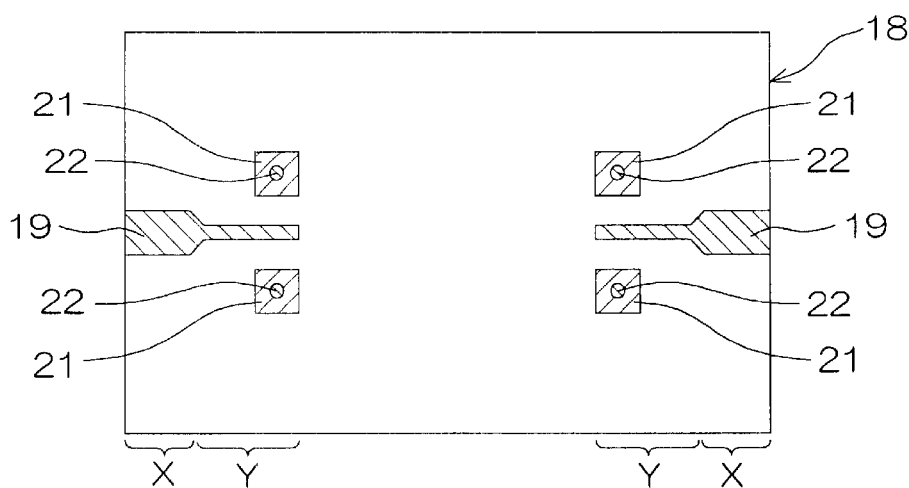
FIGS. 7A and 7B are diagrams for explaining the structure of another external circuit board on which the package shown in FIG. 4 can be mounted.
Figure 7B:
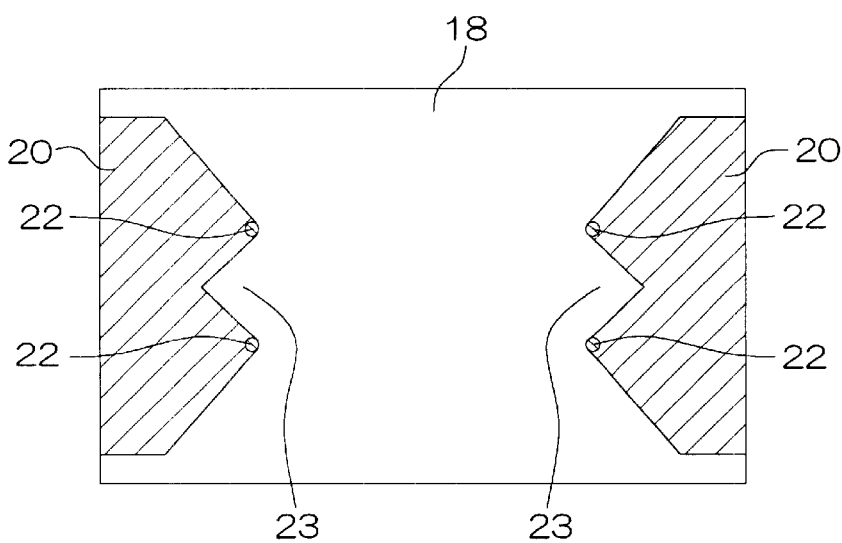

The connecting terminal portion for input and the connecting terminal portion for output may be formed on one external circuit board 18, as shown in FIG. 7A. In this case, it is preferable that grounding layers 20 having a pattern as shown in FIG. 7B are formed inside the external circuit board 18.

Figure 7C:
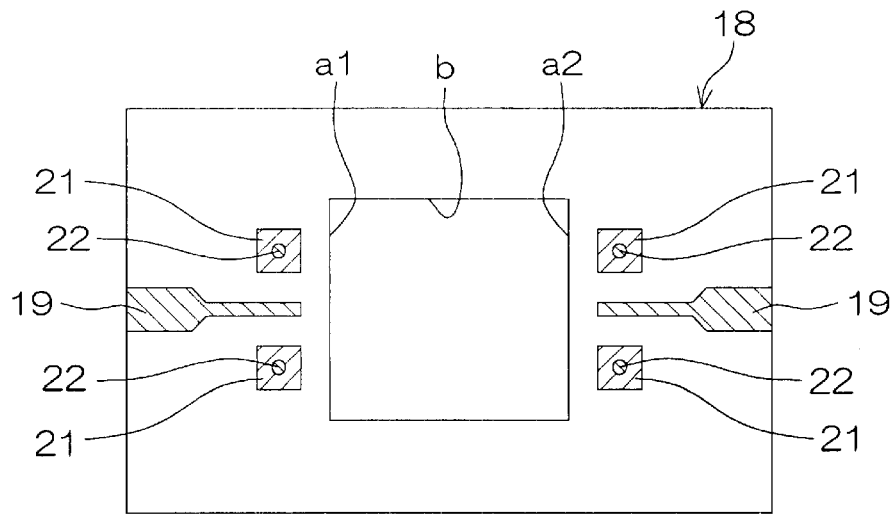
FIG. 7C is a plan view for explaining the structure of still another external circuit board.

When the one external circuit board 18 is used, it is desirable in terms of improvement in transmission characteristics that a recess b or a through hole is formed on extensions of the connecting terminal portions, and end side surfaces a1 and a2 of a dielectric board are formed in the vicinities of the connecting terminal portions, as shown in FIG. 7C.

In the package 7 shown in FIG. 4, connection between the signal conductor line 11 on its surface on which the high frequency device 10 is carried and the signal conductor line 14 on the opposite surface are made by the through hole conductor 13. However, connection between the signal conductor line 11 and the signal conductor line 14 is not limited to the same. It is also possible to electromagnetically connect both the signal conductor lines 11 and 14 by forming a slot hole (a slot line), for example, in the grounding layer 12 and opposing ends of the signal conductor lines 11 and 14 through the slot hole.

The structure of the connecting terminal portion in the present embodiment is applicable to all high frequency transmission lines, provided that the connecting terminal portion comprises at least the signal conductor line and the grounding layer. That is, it is applicable to not only the microstrip line but also a coplanar line with the ground.

Although the high frequency wiring board according to the present embodiment is applied to a case where a signal having a frequency of not less than 30 GHz is transmitted, it is particularly effective for a case where the signal frequency is not less than 40 GHz and particularly, not less than 50 GHz.

Figure 8A:
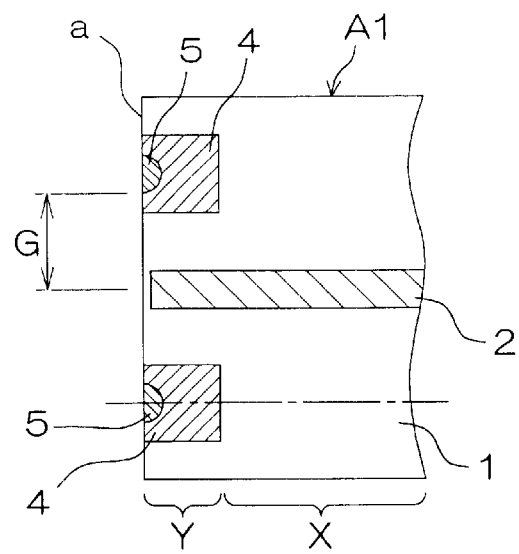
FIG. 8A is a plan view, in the vicinity of a connecting terminal portion, of a high frequency wiring board according to a second embodiment of the present invention.
Figure 8B:
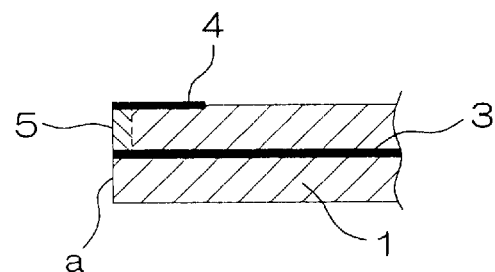
FIG. 8B is a schematic cross-sectional view thereof.
Figure 8C:
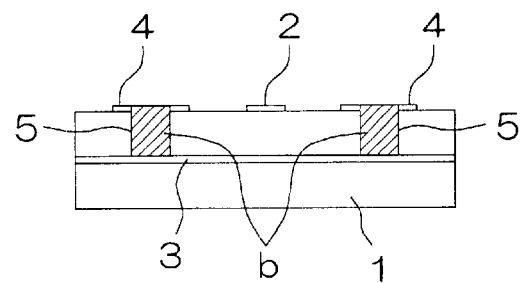
FIG. 8C is a side view thereof and FIG. 8D is a plan view showing the structure of a through conductor in enlarged fashion.

FIG. 8A is a plan view, in the vicinity of a connecting terminal portion, of a high frequency wiring board according to a second embodiment of the present invention, and FIG. 8B is a cross-sectional view and FIG. 8C is a side view thereof. In drawings relating to the description of the second embodiment, portions corresponding to the portions in the drawings relating to the description of the first embodiment are assigned the same reference numerals. However, this does not mean that the portions assigned the same reference numerals have completely the same structures.

A wiring board A1 comprises a ceramic dielectric board 1, a signal conductor line 2 (indicated by hatching) formed on its surface, and a grounding layer 3 formed parallel to the signal conductor line 2 inside the dielectric board 1. The signal conductor line 2 and the grounding layer 3 form a high frequency transmission line X having a microstrip line structure. A connecting terminal portion Y for making connection with an external circuit is formed at a terminal end of the high frequency transmission line X.

In the connecting terminal portion Y, a pair of connecting grounding conductors 4 (indicated by hatching) is provided on the surface of the dielectric board 1 on both sides of a terminal end of the signal conductor line 2. The connecting grounding conductors 4 are electrically connected to the grounding layer 3, respectively, through through conductors 5. The through conductor 5 may be a viahole conductor formed by filling a viahole provided in the dielectric board 1 with metal paste and sintering the metal paste.

Figure 8D:
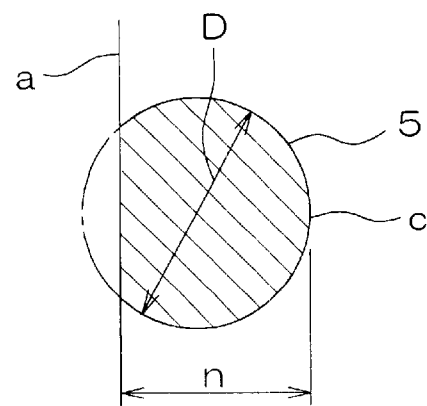

As illustrated in enlarged fashion in FIG. 8D, a side surface of each of the through conductors 5 is exposed to an end side surface a of the dielectric board 1, that is, no dielectric exists between the through conductors 5 and the end side surface a of the dielectric board 1. Consequently, it is possible to prevent the occurrence of resonance and the decreases in processability and long-term reliability due to the existence of the dialectic.

The shape of a cross section of the through conductor 5 is not particularly limited. For example, it may be a shape such as a circle, an ellipse, or a polygon. In increasing processability in a case where the through conductor 5 is exposed to the end side surface of the dielectric board 1, it is desirable that the maximum diameter D of the cross section is not more than 0.5 mm and particularly, not more than 0.3 mm.

The area of an exposed portion of the through conductor 5 is not particularly limited, provided that the side surface of the through conductor 5 is exposed. In order to increase reliability of connection as a conductor, however, the area of the exposed portion b, on the end side surface a, of the through conductor 5 may be not less than one-fifth and desirably, not less the one-second the maximum area calculated from the maximum diameter D of a through hole 5 (D× the thickness of the dielectric board 1). Further, in order to reliably make connection with the external circuit board by a solder, it is desirable that the through conductor 5 itself has a cross section of a certain degree of size. From this point of view, it is desirable that the ratio. n/D of the length n from the end side surface a of the dielectric board 1 (the exposed end side surface of the through conductor 5) to an opposite surface c of the through conductor 5 to the maximum diameter D of the cross section of the through conductor 5 is not less than 0.3.

From reasons described in relation to the first embodiment, it is desirable that the distance G between the center of the signal conductor line 2 and the through conductor 5 is not more than 0.25 λg and particularly, not more than 0.15 λg (λg: the signal wavelength, in the dielectric board, of the high frequency signal). Therefore, the reflection of the signal is diminished, thereby making it possible to pass and transmit the high frequency signal having a frequency of not less than 30 GHz.

Figure 9:
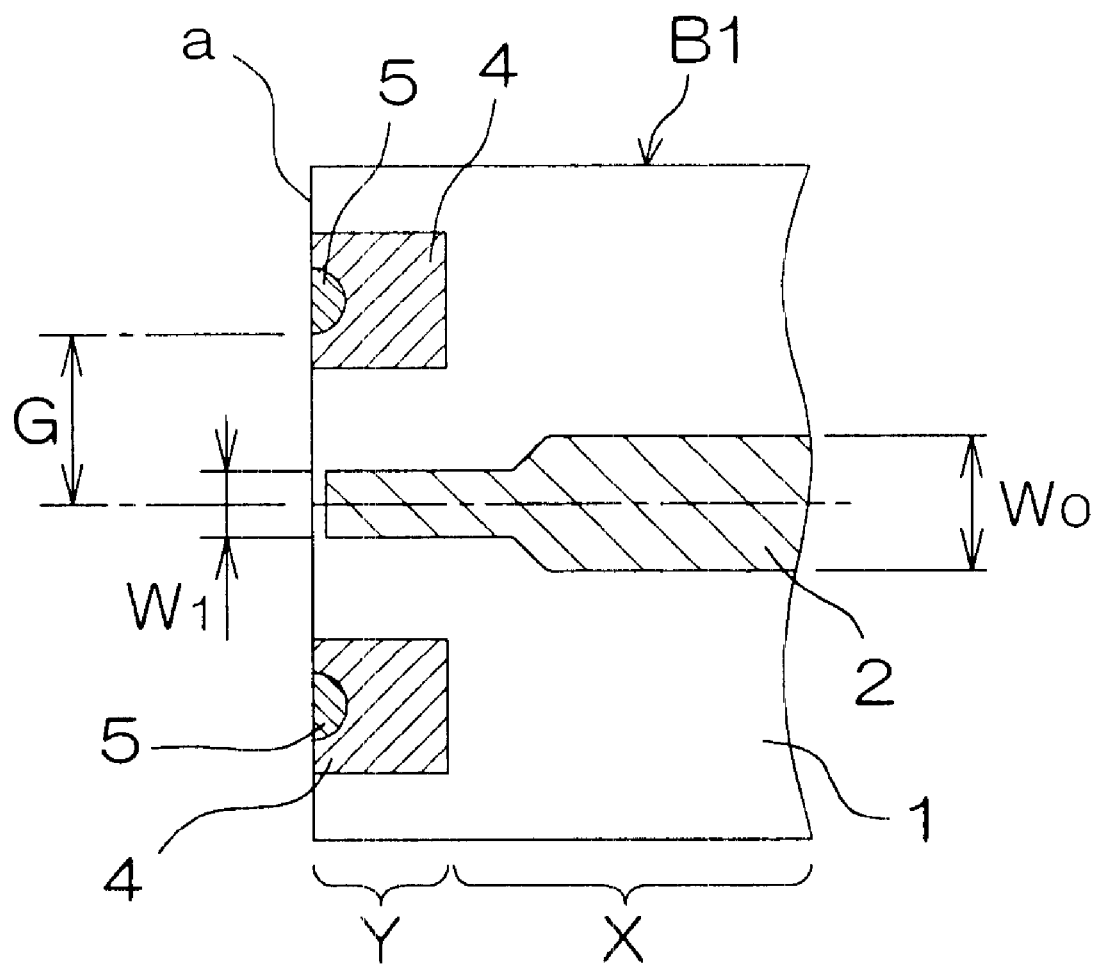
FIG. 9 is a plan view showing a preferable modified example of the wiring board shown in FIGS. 8A, 8B, 8C, and 8D.

As shown in FIG. 9, it is preferable that the width, in a connecting terminal portion Y, of a signal conductor line 2 on a wiring board B1 is smaller than the width, in a high frequency transmission line X, of the signal conductor line 2. Specifically, letting W0 be the width, in the high frequency transmission line X, of the signal conductor line 2, and letting W1 be the width, in the connecting terminal portion Y, of the signal conductor line 2, it is desirable that a relationship of 0.4 W0≦W1≦0.8 W0 is satisfied. Consequently, it is preferable that the impedance Z1, in a cross section perpendicular to the direction of signal transmission, of the connecting terminal portion Y is set so as to satisfy a relationship of 1.4 Z0≦Z1≦1.8 Z0 with the impedance Z0, in a cross section perpendicular to the direction of signal transmission, of the high frequency transmission line X. The reason is as described in relation to the first embodiment.

The reflection of the signal can be effectively diminished, as described above, even by taking a region Z (FIGS. 10A to 10C) positioned between at least the paired through conductors 5 in the grounding layer and facing to the signal conductor line 2, that is, a region Z where a line segment region connecting the paired through conductors 5 and the signal conductor line 2 are overlapped with each other, as viewed from the top, as a non-grounding region in the connecting terminal portion Y on the wiring board.

Figure 10A:
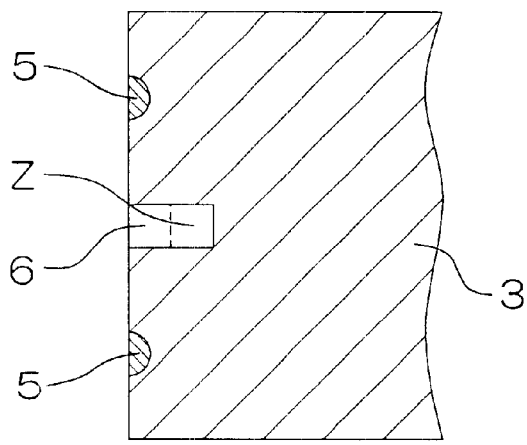
FIGS. 10A, 10B, and 10C are pattern diagrams of a grounding layer in the wiring board shown in FIGS. 8A, 8B, 8C, and 8D.

The non-grounding region 6 may be any region, provided that it includes the region Z. That is, the transmission loss can be further reduced even by taking not only the region Z but also a region from the region Z to an end side surface of the grounding layer 3, as shown in FIG. 10A, for example, as the non-grounding region 6.

Figure 10B:
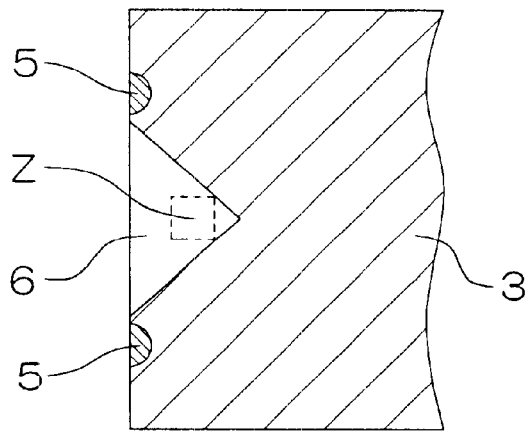

It is desirable that the non-grounding region 6 is formed so as to include the region Z and continuously or gradually expand toward the terminal end of the signal conductor line 2, as shown in FIG. 10B. By thus forming the non-grounding region 6 in an approximately V shape, it is possible to smooth the change in an electromagnetic field distribution from the high frequency transmission line X to the connecting terminal portion Y on the wiring board. Consequently, the reflection of the signal can be diminished.

Figure 10C:
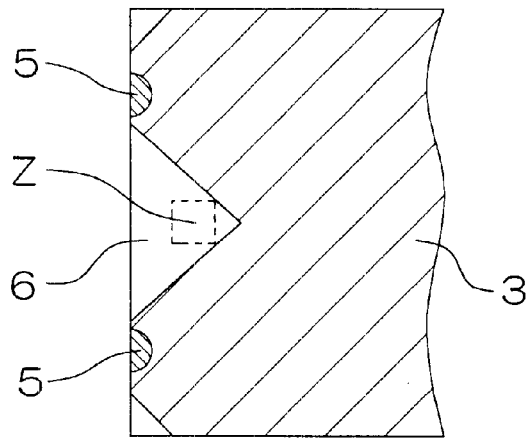

Furthermore, the non-grounding region 6 is not limited to a region, interposed between the through conductors 5, in the grounding layer 3. For example, the non-grounding region 6 may be continuously or gradually expanded toward the terminal end of the signal conductor line 2 outside the through conductors 5, as shown in FIG. 10C. That is, the non-grounding region 6 is formed in a so-called W shape, thereby making it possible to further smooth the change in the electromagnetic field distribution. Consequently, the reflection of the signal can be diminished.

Figure 11:
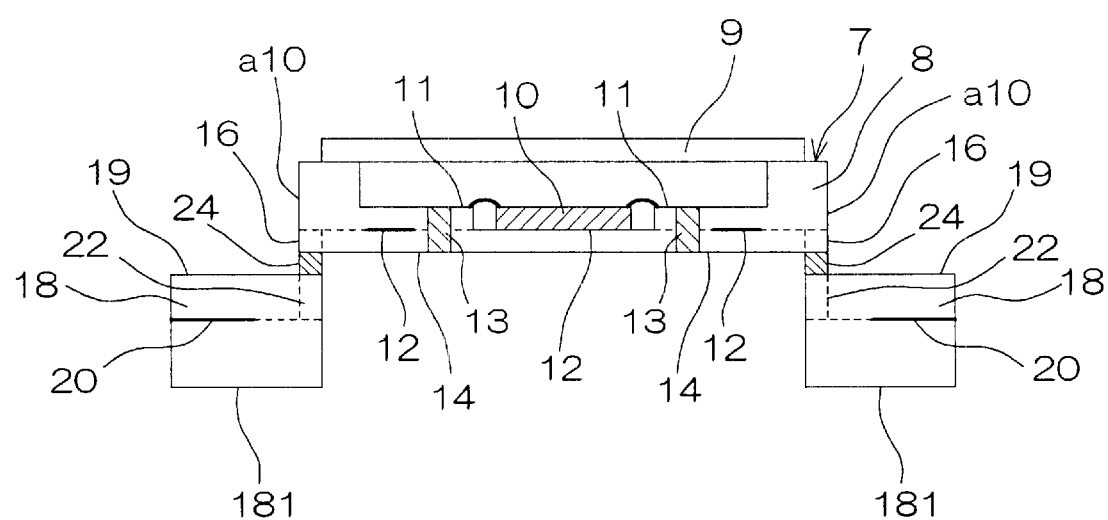
FIG. 11 is a schematic cross-sectional view for explaining an example of a connecting structure of the high frequency wiring board shown in FIGS. 8A, 8B, 8C, and 8D.

FIG. 11 is an illustrative cross-sectional view showing a connecting structure in a case where a package 7 carrying a high frequency device is mounted on an external circuit board. In the package 7, a dielectric board 8 and a cover 9 form a cavity in its inner part. A high frequency device is contained in the cavity.

Figure 12A:
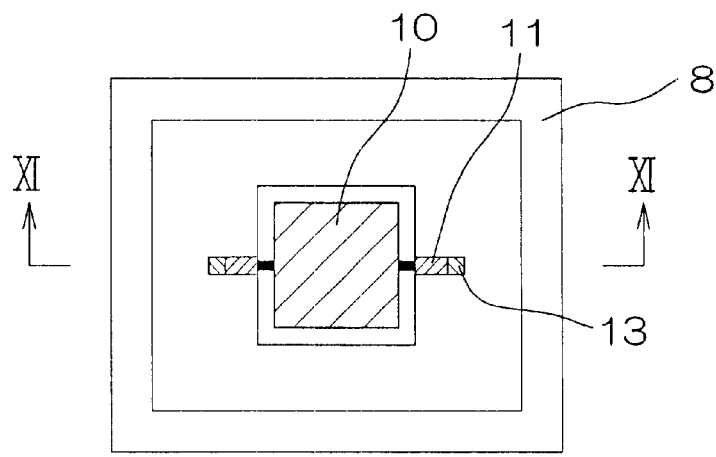
FIG. 12A is a plan view of a dielectric board in the high frequency wiring board shown in FIG. 11.

FIG. 12A is a plan view showing a state where the cover 9 is removed. Two signal conductor lines 11 for input and output each having its one end connected to the high frequency device 10 by a ribbon or the like are formed on a surface, on which the high frequency device 10 is carried, of the dielectric board 8.

Figure 12B:
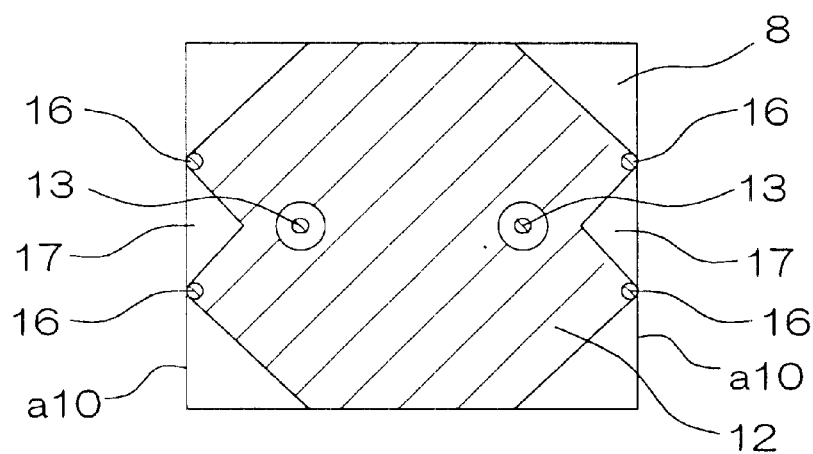
FIG. 12B is a pattern diagram of a grounding layer inside the dielectric board.

Inside the dielectric board 8, a grounding layer 12 (indicated by hatching) having its end in a W shape, as in the case of FIG. 10B, is embedded, as shown in a pattern diagram of FIG. 12B. The signal conductor line 11 and the grounding layer 12 form a high frequency transmission line having a microstrip line structure.

The other end of the signal conductor line 11 is connected to a through conductor 13. The through conductor 13 is formed so as not to come into contact with the grounding layer 12 upon penetrating the dielectric board 8, is led to the opposite surface of the dielectric board 8, and is electrically connected to a signal conductor line 14. Consequently, the signal conductor line 11 is electrically connected to the signal conductor line 14. The signal conductor line 14 and the grounding layer 12 form a high frequency transmission line X having a microstrip line structure.

Figure 12C:
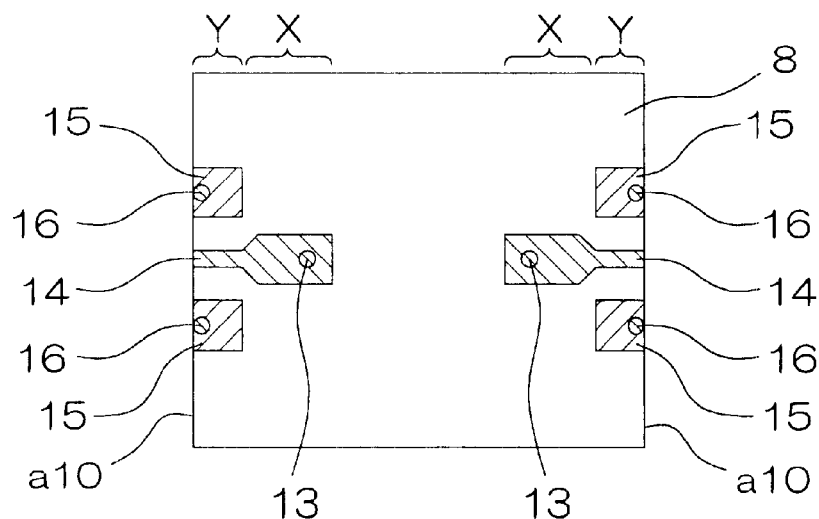
FIG. 12C is a bottom view of the dielectric board.

On the reverse surface of the dielectric board 8, the two signal conductor lines 14 for input and output (indicated by hatching) are formed, as shown in a plan view of FIG. 12C. A pair of connecting grounding conductors 15 (indicated by hatching) is provided with spacing on both sides of a terminal end of each of the signal conductor lines 14, thereby forming a connecting terminal portion Y. The connecting grounding conductors 15 are electrically connected to the grounding layer 12 inside the dielectric board 8, respectively, via through conductors 16. The line width, in the connecting terminal portion Y, of the signal conductor line 14 is made smaller than the line width, in the high frequency transmission line X, of the signal conductor line 14.

The through conductor 16 is arranged such that its side surface is exposed toward an end side surface a10 of the dielectric board 8 in the connecting terminal portion Y on the high frequency wiring board.

On the other hand, an external circuit board 18 on which the package 7 is mounted has individual external circuit boards 181 for input and output.

Figure 13A:
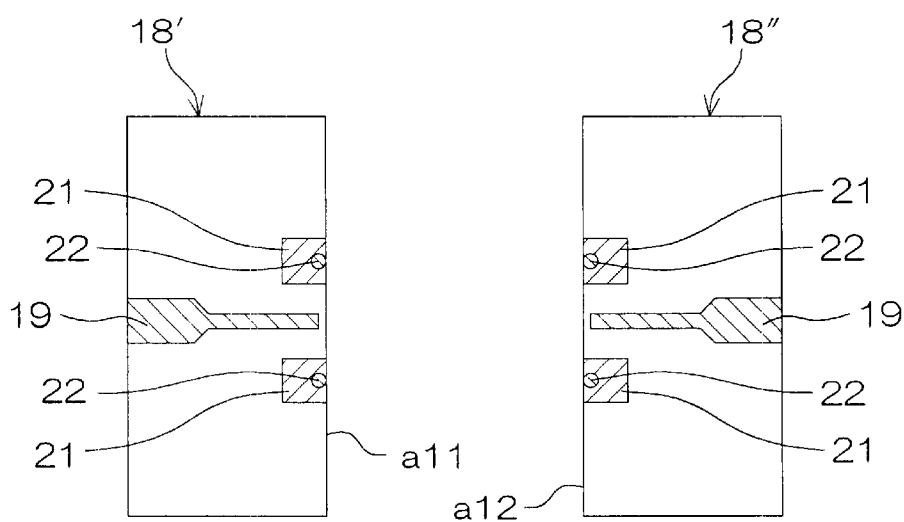
FIG. 13A is a plan view for explaining the structure of an external circuit board on which a package shown in FIG. 11 is mounted.
Figure 13B:
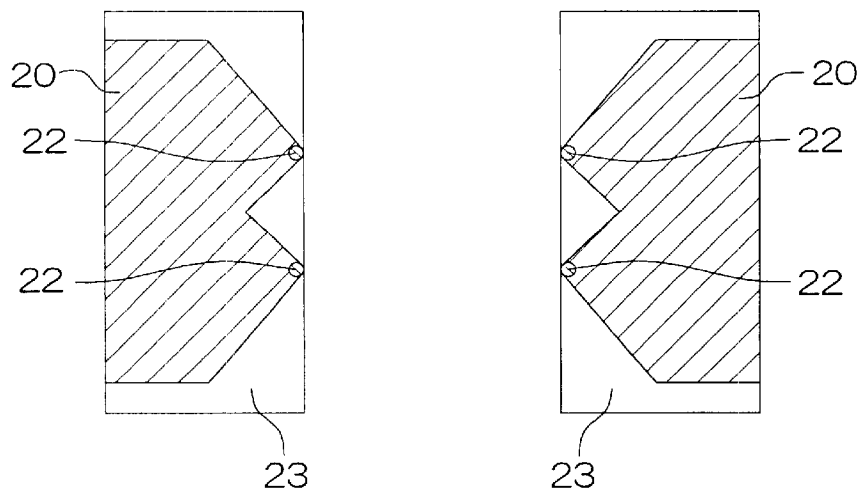
FIG. 13B is a pattern diagram of a grounding layer formed inside the external circuit board.

FIG. 13A is a plan view of the external circuit boards 181 and 182. Two signal conductor lines 19 (indicated by hatching) for input and output to and from the package 7 are respectively formed on the surfaces of the external circuit boards 181 and 182. Grounding layers 20 are respectively formed inside the external circuit boards 181 and 182. The grounding layer 20, together with a signal conductor line 19, forms a microstrip line. The grounding layer 20 has its end in a W shape in the connecting terminal portion Y, as shown in FIG. 13B.

Connecting terminal portions Y are respectively formed at terminal ends of the signal conductor lines 19 for input and output. In the connecting terminal portion Y, a pair of connecting grounding conductors 21 (indicated by hatching) is formed with spacing, as in the case of the connecting terminal portion Y in the package 7, on both sides of each of the signal conductor lines 19. The connecting grounding conductors 21 are electrically connected to the grounding layers 20, respectively, through through conductors 22. The line width, in the connecting terminal portion Y, of the signal conductor line 19 is made smaller than the line width, in the other high frequency transmission line, of the signal conductor line 19.

The through conductors 22 are arranged so as to be respectively exposed to end side surface s all and a12 of the external circuit boards 181 and 182.

The package 7 is surface-mounted on the external circuit board 18 (181, 182) by soldering reflow and the like, as shown in FIG. 11. That is, the signal conductor lines 14 and 19 are abutted against each other, and the connecting grounding conductors 15 and 21 are abutted against each other. By solders 24, the signal conductor line 14 on the package 7 and the signal conductor line 19 on each of the external circuit boards 181 and 182 are electrically connected to each other, and the connecting grounding conductors 15 on the package 7 and the connecting grounding conductors 21 on each of the external circuit boards 181 and 182 are electrically connected to each other, respectively. It is also possible to join and fix the signal conductor lines 14 and 19 and join and fix the connecting grounding conductors 15 and 21, respectively, by the solders via bumps or ball-shaped terminals having a higher melting point than that of the solders.

According to such a mounting structure, in the connecting terminal portions for connection between the package 7 and the external circuit boards 181 and 182, it is possible to prevent resonance between the through conductors 16 and the end side surface a10 of the dielectric board 8 and resonance between the through conductors 22 and each of the end side surfaces all and a12 of the external circuit boards 181 and 182. Consequently, there can be provided a mounting structure in which transmission loss between the package 7 and the external circuit boards 181 and 182 has been reduced.

Figure 13C:
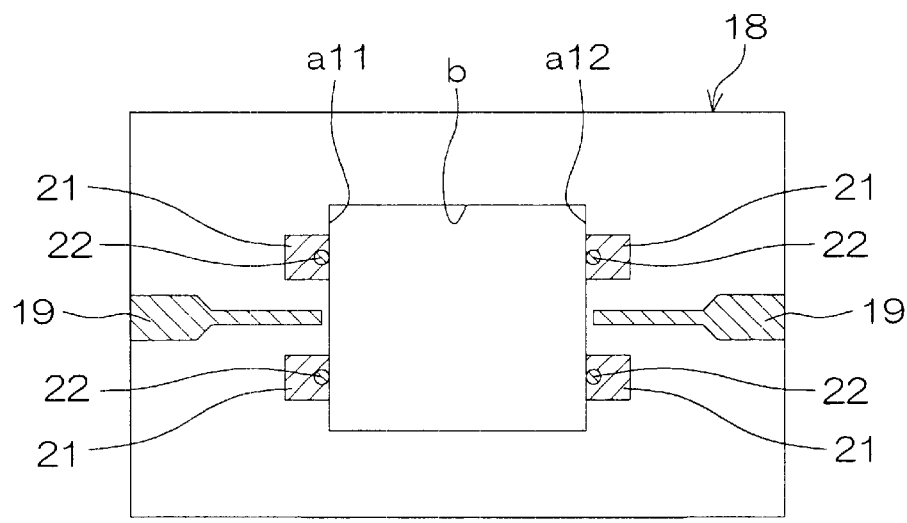
FIG. 13C is a plan view for explaining the structure of another external circuit board on which the package shown in FIG. 11 can be mounted.

The connecting terminal portion for input and the connecting terminal portion for output may be formed on one external circuit board 18, as shown in FIG. 13C. In this case, it is desirable in terms of improvement in transmission characteristics that a recess b or a through hole is formed on extensions of the connecting terminal portions to form end side surfaces a11 and a12 of a dielectric board, and the through conductors 22 are exposed from the end side surfaces a11 and a12.

In the package 7 having the structure shown in FIG. 11, connection between the signal conductor line 11 on its surface on which the high frequency device 10 is carried and the signal conductor line 14 on the opposite surface are made by the through conductor 13. However, it is possible to electromagnetically connect both the signal conductor lines 11 and 14 by forming a slot hole (a slot line), for example, in the grounding layer 12 and opposing ends of the signal conductor lines 11 and 14 through the slot hole.

The structure of the connecting terminal portion in the present embodiment is applicable to all high frequency transmission lines, provided that the connecting terminal portion comprises at least the signal conductor line and the grounding layer. That is, it is applicable to not only the microstrip line but also a coplanar line with the ground.

Although the high frequency wiring board according to the present embodiment is applied to a case where a signal having a frequency of not less than 30 GHz is transmitted, it is particularly effective for a case where the signal frequency is not less than 40 GHz and particularly, not less than 50 GHz.

EXAMPLE 1

Figure 14A:
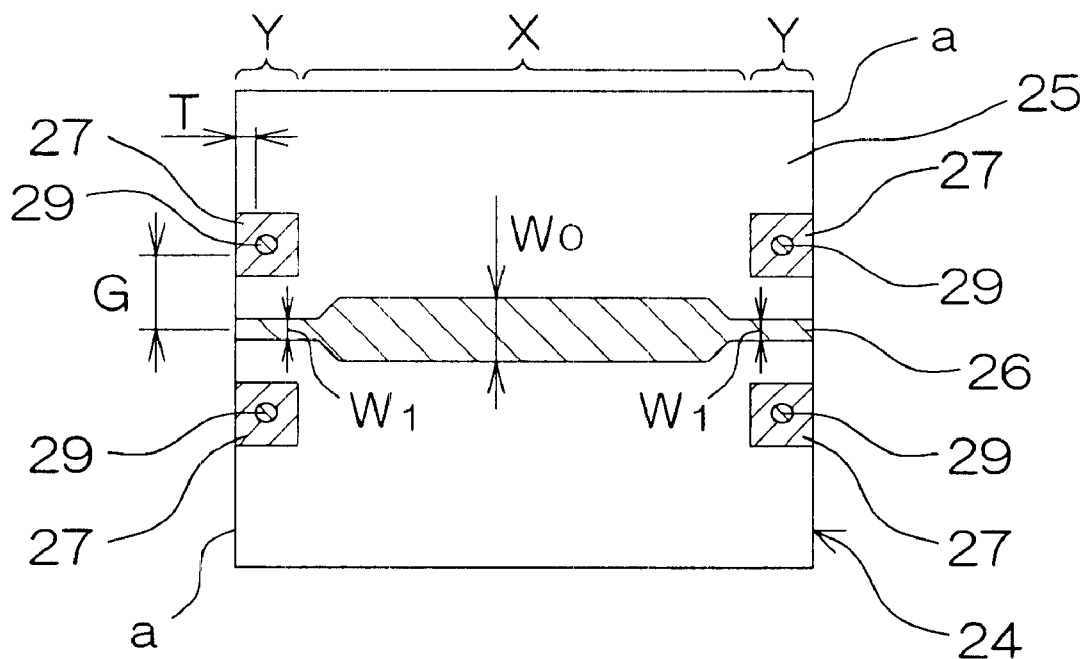
FIG. 14A is a plan view showing a surface, on the side of mounting, of a dielectric board for explaining the structure of the evaluating wiring board according to the first embodiment.

Transmission characteristics after surface-mounting a high frequency wiring board on an external circuit board were measured. The structure of an evaluating wiring board 24 used for the measurement is shown in FIGS. 14A and 14B.

Figure 14B:
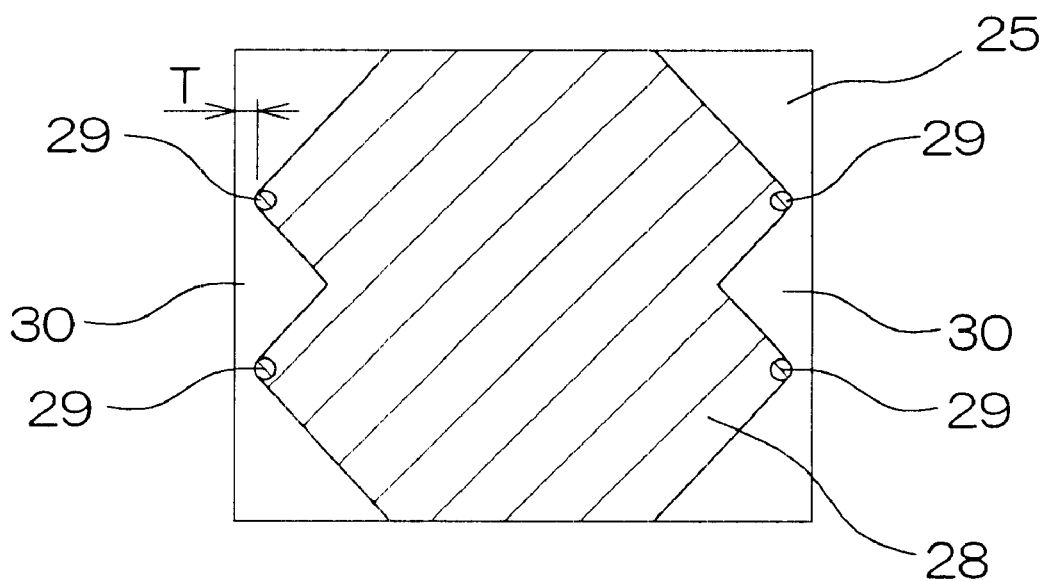
FIG. 14B is a pattern diagram of a grounding layer in the evaluating wiring board.

In the evaluating wiring board 24, a signal conductor line 26 (indicated by hatching), width (W0) in line width, having two terminal ends was formed on a surface, on the side of mounting, of a dielectric board 25, and a grounding layer 28 (indicated by hatching) shown in FIG. 14B was formed inside the dielectric board 25, to form a high frequency transmission line X composed of a microstrip line. A pair of connecting grounding conductors 27 (indicated by hatching) having a diameter of 0.16 mm$\phi$ was formed on both sides of each of the terminal ends of the signal conductor line 26. The connecting grounding conductors 27 and the grounding layer 28 were electrically connected to each other by through conductors (viaholes) 29 having a diameter of 0.10 mm$\phi$. A connecting terminal portion Y was thus formed. Further, the ratio (W1/W0) of the line width, in the connecting terminal portion Y, of the signal conductor line 26 was changed, as shown in Table 1.

The distance G between the center of the signal conductor line 26 and the through conductor 29 was set to 0.15 $\lambda$g ($\lambda$g: the signal wavelength, in the dielectric board 25, of a high frequency signal).

The position of the through conductor 29 was changed, to prepare several types of samples which differ, as shown in Table 1, in the distance T between an end side surface a of the dielectric board 25 and the through conductor 29. Except in the samples assigned the sample numbers 1-5, 1-9, and 1-19, a non-grounding region 30 having its end in an approximately W shape was formed, as described in relation to FIG. 3C, in a portion facing to the connecting terminal portion Y on the grounding layer 28.

The evaluating wiring board 24 was connected to and mounted on an external circuit board 18 having connecting terminal portions having the structures shown in FIGS. 6A and 6B though solder. With respect to the external circuit board 18 on which the evaluating wiring board 24 had been surface-mounted, signal insertion loss S21 was measured as transmission characteristics at a frequency of 30 GHz from the one connecting terminal portion on the external circuit board 18 to the other connecting terminal portion via the evaluating wiring board 24.

For the evaluating wiring board 24 and the external circuit board 18, a fluororesin board having a dielectric constant of 2, a printed board having a dielectric constant of 4, an alumina board (a signal wavelength of 2 mm at a frequency of 30 GHz in the dielectric board) having a dielectric constant of 9, and a glass ceramic board having dielectric constants of 12 and 15 were used. A signal conductor line, a grounding layer, a connecting grounding conductor, and a through conductor were formed using copper in a fluororesin board, an epoxy printed board, and a glass ceramic board, while using tungsten in an alumina board. A through conductor was formed by simultaneous sintering in the ceramic board. Exposed surfaces of the signal conductor line and the connecting grounding conductor were gold-plated.

TABLE 1

| sample No. | dielectric constant $\epsilon$ | distance T (mm) | T/$\lambda$g | $W_1/W_0$ | non-grounding region | insertion loss (dB) | note |
|---|---|---|---|---|---|---|---|
| 1-1 | 2.0 | 1.0 | 0.24 | 0.5 | Yes | −1.2 | |
| 1-2 | 2.0 | 1.2 | 0.28 | 0.5 | Yes | −1.4 | |
| *1-3 | 2.0 | 1.4 | 0.33 | 0.5 | Yes | −4.5 | |
| 1-4 | 4.0 | 0.60 | 0.20 | 1.0 | Yes | 17 | |
| 1-5 | 4.0 | 0.60 | 0.20 | 0.5 | No | 16 | |
| 1-6 | 4.0 | 0.60 | 0.20 | 0.5 | Yes | −1.1 | |
| 1-7 | 4.0 | 0.80 | 0.27 | 0.5 | Yes | −1.4 | |
| *1-8 | 4.0 | 1.0 | 0.33 | 0.5 | Yes | −3.0 | |
| 1-9 | 9.0 | 0.40 | 0.20 | 1.0 | No | 1.7 | |
| 1-10 | 9.0 | 0.40 | 0.20 | 1.0 | Yes | 1.2 | |
| 1-11 | 9.0 | 0.40 | 0.20 | 0.5 | Yes | −1.0 | |
| 1-12 | 9.0 | 0.60 | 0.30 | 0.5 | Yes | −1.5 | |
| *1-13 | 9.0 | 0.80 | 0.40 | 0.5 | Yes | −6.6 | |
| *1-14 | 12.0 | 0.03 | 0.017 | 0.5 | Yes | — | no via |
| 1-15 | 12.0 | 0.08 | 0.046 | 0.5 | Yes | 1.0 | hole |
| 1-16 | 12.0 | 0.20 | 0.12 | 0.5 | Yes | −1.0 | can be |
| 1-17 | 12.0 | 0.40 | 0.23 | 0.5 | Yes | −1.2 | formed |
| *1-18 | 12.0 | 0.60 | 0.35 | 0.5 | Yes | −5.0 | |
| 1-19 | 15.0 | 0.20 | 0.13 | 1.0 | No | 1.9 | |
| 1-20 | 15.0 | 0.20 | 0.13 | 1.0 | Yes | 1.6 | no via |

TABLE 1-continued

| sample No. | dielectric constant ε | distance T (mm) | T/λg | W₁/W₀ | non-grounding region | insertion loss (dB) | note |
|---|---|---|---|---|---|---|---|
| *1-21 | 15.0 | 0.04 | 0.03 | 0.5 | Yes | — | hole can be formed |
| 1-22 | 15.0 | 0.10 | 0.06 | 0.5 | Yes | 1.1 | |
| 1-23 | 15.0 | 0.20 | 0.13 | 0.5 | Yes | −1.2 | |
| 1-24 | 15.0 | 0.40 | 0.26 | 0.5 | Yes | −1.6 | |
| *1-25 | 15.0 | 0.60 | 0.39 | 0.5 | Yes | −7.3 | |

*mark indicates a sample in which a problem occurred.

As apparent from the results of Table 1, in the samples assigned the sample numbers 1-3, 1-8, 1-13, 1-18, and 1-25 in which the distance T from the end side surface of the dielectric board to the through conductor was larger than 0.3 times the signal wavelength (λg), in the dielectric board, of the high frequency signal, the insertion loss after the mounting was large. Further, in the samples assigned the sample numbers 1-14 and 1-21 in which the distance T was less than 0.05 mm, a portion between the viahole and the end side surface of the dielectric board was cracked at the time of processing the viahole. Accordingly, a good viahole could not be formed.

Contrary to this, it was found that the insertion loss after the mounting could be decreased by setting the distance T from the end side surface of the dielectric board to the through conductor to not more than 0.3 times the signal wavelength (λg), in the dielectric board, of the high frequency signal to prevent resonance between the through conductor and the end side surface of the dielectric board.

In the sample in which the line width W1, in the connecting terminal portion, of the signal conductor line was smaller than the line width W0, in the high frequency transmission line, of the signal conductor line, the insertion loss could be made smaller than that in the sample in which W1=W0.

Furthermore, it was found that in the sample in which a non-grounding region was provided, the insertion loss could be further reduced, as compared with those in the samples assigned the sample numbers 1-5, 1-9, and 1-19 in which there was no non-grounding region.

EXAMPLE 2

In the same manner as the example 1, an evaluating wiring board 24 having the structure shown in FIGS. 14A and 14B was used, to measure transmission characteristics after surface-mounting on an external circuit board.

The position of a through conductor 29 was changed, to prepare several types of samples which differ in the distance G between the center of a signal conductor line 26 and the through conductor 29.

The evaluating wiring board 24 was connected to and mounted on an external circuit board 18 having connecting terminal portions having the structures shown in FIGS. 6A and 6B through solder. With respect to the external circuit board 18 on which the evaluating wiring board 24 had been surface-mounted, signal insertion loss S21 was measured as transmission characteristics at a frequency of 50 GHz from the one connecting terminal portion on the external circuit board 18 to the other connecting terminal portion via the evaluating wiring board 24.

For the evaluating wiring board 24 and the external circuit board 18, an alumina board having a dielectric constant of 8.9 (a signal wavelength of 2 mm at a frequency of 50 GHz in the dielectric board) was used. A signal conductor line, a grounding layer, a connecting grounding conductor, and a through conductor were all formed by simultaneous sintering using tungsten metallization. Exposed surfaces of the signal conductor line and the connecting grounding conductor were gold-plated. The line width of the signal conductor line 26 was set to 0.16 mm, and the line width W1, in each of the connecting terminal portions, of the signal conductor line 26 was shown in Table 2.

With respect to the samples assigned the sample numbers 2-5 to 2-8, a non-grounding region 30 having its end in an approximately W shape was formed, as explained in FIG. 3C, was formed in a portion facing to the connecting terminal portion on a grounding layer 28.

TABLE 2

| sample No. | G (mm) | G/λg | W1 (mm) | non-grounding region | S21 (dB) |
|---|---|---|---|---|---|
| *2-1 | 0.8 | 0.40 | 0.16 | No | −9.6 |
| *2-2 | 0.6 | 0.30 | 0.16 | No | −4.0 |
| 2-3 | 0.5 | 0.25 | 0.16 | No | −1.9 |
| 2-4 | 0.5 | 0.25 | 0.08 | No | −1.6 |
| 2-5 | 0.5 | 0.25 | 0.08 | Yes | −1.3 |
| 2-6 | 0.4 | 0.20 | 0.08 | Yes | −1.2 |
| 2-7 | 0.3 | 0.15 | 0.08 | Yes | −1.0 |
| 2-8 | 0.2 | 0.10 | 0.08 | Yes | −1.0 |

*; a sample in which a problem occurred
G; the distance between the center of a signal conductor line and a through conductor
W0; 0.16 mm
λg; the wavelength, in a dielectric board, of a signal having a frequency of 50 GHz; 2 mm in the case of alumina
S21; the insertion loss of the signal having a frequency of 50 GHz As apparent from the results of Table 2, in the samples assigned the sample numbers 2-1 and 2-2 in which the distance G between the signal conductor line and the through conductor was set to more than 0.25 times the signal wavelength λg, in the dielectric board, of a high frequency signal, the insertion loss after the mounting was large.

Contrary to this, it was found that in the samples assigned the sample numbers 2-3 to 2-8 in which the distance G was set to not more than 0.25 times the signal wavelength λg, the insertion loss could be reduced.

In the samples assigned the sample numbers 2-4 to 2-8 in which the line width W1, in the connecting terminal portion, of the signal conductor line was smaller than the line width W0, in the high frequency transmission line, of the signal conductor line, the insertion loss could be made smaller than that in the sample assigned the sample number 2-3 in which the width W1, in the connecting terminal portion, of the signal terminal portion of the signal conductor line was the same as the width W0, in the high frequency transmission line, of the signal conductor line. Further, it was found that in the samples assigned the sample numbers 2-5 to 2-8 in which a non-grounding region was provided, the insertion loss could be further reduced.

EXAMPLE 3

In the same manner as the example 1, an evaluating wiring board 24 having the structure shown in FIGS. 14A and 14B was used, to measure transmission characteristics after surface-mounting on an external circuit board.

The line width, in a high frequency transmission line, of a signal conductor line 26 was set to 0.16 mm, and several types of samples which differ in the line width W1, in a connecting terminal portion Y, of the signal conductor line 26 were prepared.

The evaluating wiring board 24 was connected to and mounted on an external circuit board 18 having connecting terminal portions having the structures shown in FIGS. 6A and 6B through solder. With respect to the external circuit board 18 on which the evaluating wiring board 24 had been surface-mounted, signal insertion loss S21 was measured as transmission characteristics at a frequency of 50 GHz from the one connecting terminal portion on the external circuit board 18 to the other connecting terminal portion via the evaluating wiring board 24.

For the evaluating wiring board 24 and the external circuit board 18, an alumina board having a dielectric constant of 8.9 (a signal wavelength of 2 mm at a frequency of 50 GHz in the dielectric board) was used. A signal conductor line, a grounding layer, a connecting grounding conductor, and a through conductor were all formed by simultaneous sintering using tungsten metallization. Exposed surfaces of the signal conductor line and the connecting grounding conductor were gold-plated.

The impedance Z0, in a cross section perpendicular to the direction of signal transmission, of the high frequency transmission line at a frequency of 50 GHz, the impedance Z1, in a cross section perpendicular to the direction of signal transmission, of the connecting terminal portion, and the impedance Z2, in a cross section perpendicular to the direction of signal transmission, of a connecting portion after the mounting were found by simulation, and Z1/Z0 and Z2/Z0 were further found by calculation. The results of the calculation were shown in Table 3. For the simulation, an electromagnetic field simulator HFSS (Version 5.3, manufactured by HP Co., Ltd.) commercially available was used.

With respect to the samples assigned the sample numbers 3-1 to 3-7, a non-grounding region 30 having its end in an approximately W shape, as shown in FIG. 6B, was formed in a portion facing to the connecting terminal portion on a grounding layer 28. With respect to the samples assigned the sample numbers 3-8 and 3-9, a wiring board was formed without forming a non-grounding region.

TABLE 3

| sample NO. | $W_1$ (mm) | $W_1/W_0$ | non-grounding region | $Z_1/Z_0$ | $Z_2/Z_0$ | insertion loss S21 (dB) |
|---|---|---|---|---|---|---|
| *3-1 | 0.16 | 1.0 | Yes | 1.2 | 0.9 | −8.8 |
| *3-2 | 0.14 | 0.88 | Yes | 1.3 | 1.0 | −4.2 |
| 3-3 | 0.12 | 0.75 | Yes | 1.4 | 1.1 | −1.8 |
| 3-4 | 0.11 | 0.69 | Yes | 1.6 | 1.1 | −1.4 |
| 3-5 | 0.08 | 0.50 | Yes | 1.7 | 1.4 | −1.2 |
| 3-6 | 0.07 | 0.44 | Yes | 1.8 | 1.4 | −1.5 |
| *3-7 | 0.05 | 0.31 | Yes | 2.1 | 1.5 | −4.0 |
| 3-8 | 0.11 | 0.69 | No | 1.4 | 0.9 | −1.8 |
| 3-9 | 0.08 | 0.50 | No | 1.5 | 1.2 | −1.4 |

*mark indicates a sample in which a problem occurred.
$W_0$ = 0.16 mm

As apparent from the results of Table 3, in the samples assigned the sample numbers 3-1 and 3-2 in which the impedance Z1, in the cross section perpendicular to the direction of signal transmission, of the connecting terminal portion was smaller than 1.4 times the impedance Z0, in the cross section perpendicular to the direction of signal transmission, of the high frequency transmission line, the insertion loss after the mounting was large. Also with respect to the sample assigned the sample number 3-7 in which the impedance Z1 was larger than 1.8 times the impedance Z0, the insertion loss after the mounting was large.

Contrary to this, it was found that in the samples assigned the sample numbers 3-3 to 3-6, 3-8 and 3-9 satisfying 1.4 Z0≦Z1≦1.8 Z0, the insertion loss could be reduced.

From comparison among the samples assigned the sample numbers 3-4, 3-5, 3-8, and 3-9, it was found that when a non-grounding region was provided, the impedance could be increased, thereby making it possible to further reduce the insertion loss.

It was found that the impedance Z1, in the cross section perpendicular to the direction of signal transmission, of the connecting terminal portion on the wiring board before the mounting was thus set so as to satisfy the relationship of 1.4 Z0≦Z1≦1.8 Z0 with the impedance Z0, in the cross section perpendicular to the direction of signal transmission, of the high frequency transmission line, thereby reducing the transmission loss after the mounting. Although in the design of the conventional high frequency circuit, the impedance Z1 in the cross section of the connecting terminal portion and the impedance Z0 in the cross section of the high frequency transmission line were matched with each other, and the impedance Z2 in the cross section of the connecting portion after the mounting was matched with the impedance Z0 in the cross section of the high frequency transmission line, the transmission loss was increased in this construction.

EXAMPLE 4

Figure 15A:
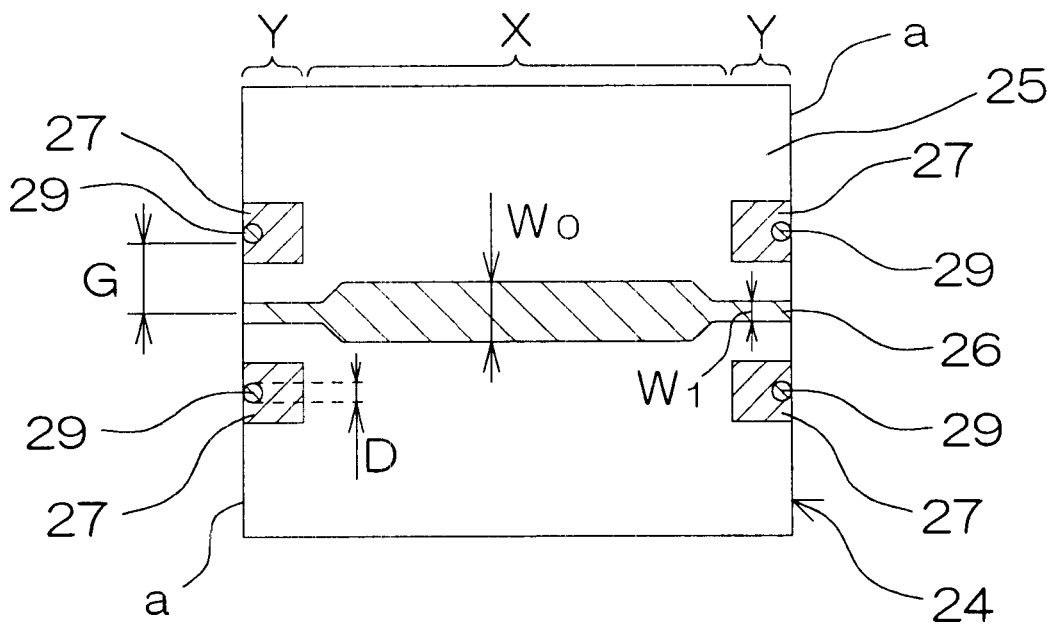
FIG. 15A is a plan view showing a surface, on the side of mounting, of a dielectric board for explaining the structure of the evaluating wiring board according to the second embodiment.
Figure 15B:
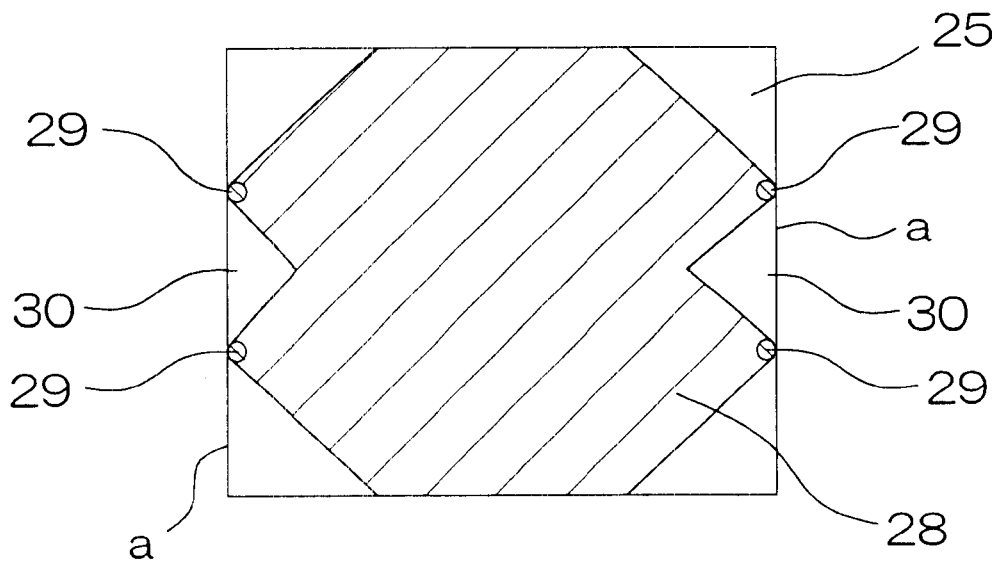
FIG. 15B is a pattern diagram of a grounding layer in the evaluating wiring board.
Figure 16A:
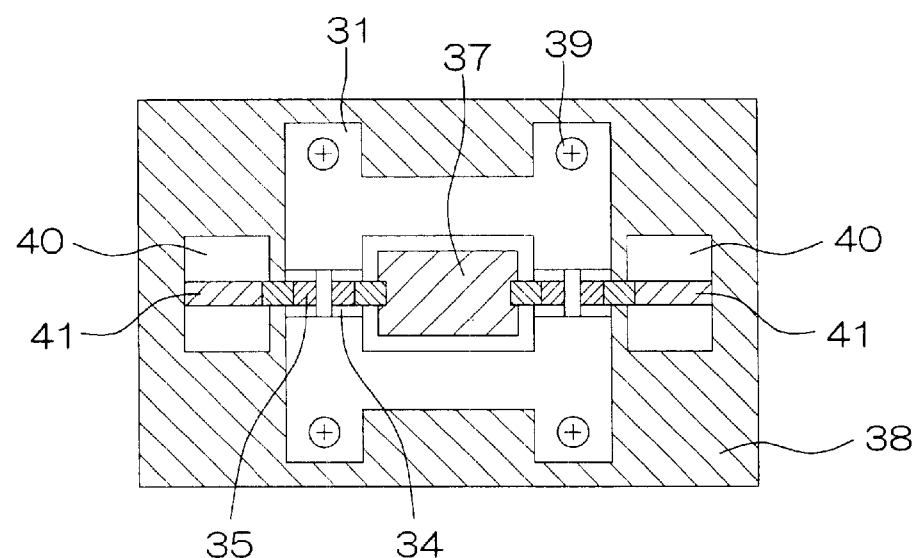
FIG. 16A is a plan view for explaining the structure of a conventional metal package.
Figure 16B:
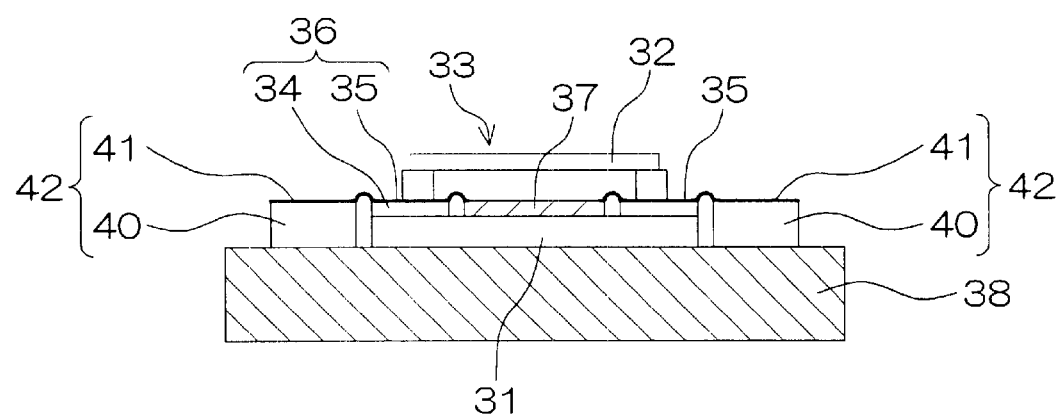
FIG. 16B is a cross-sectional view thereof.
Figure 17:
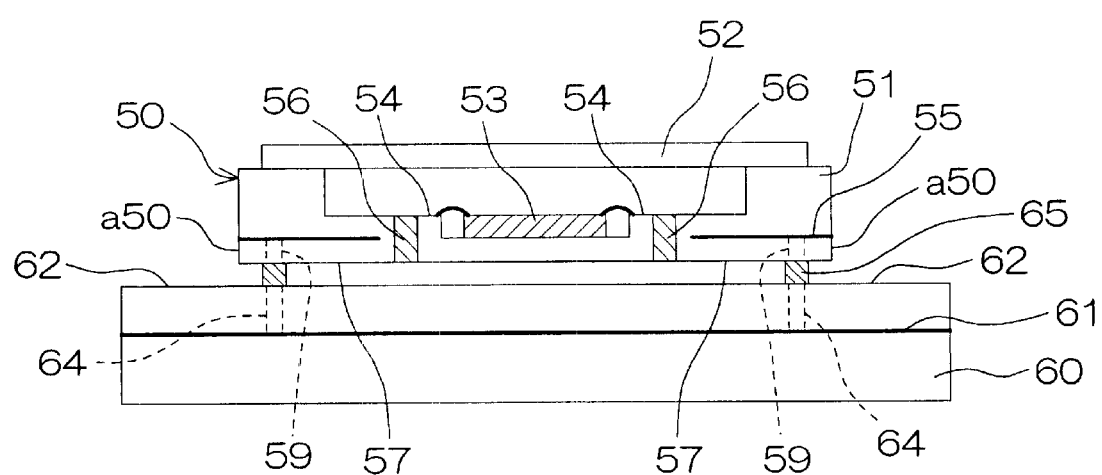
FIG. 17 is a schematic cross-sectional view for explaining a mounting structure of a conventional surface mounting type high frequency package.
Figure 18A:
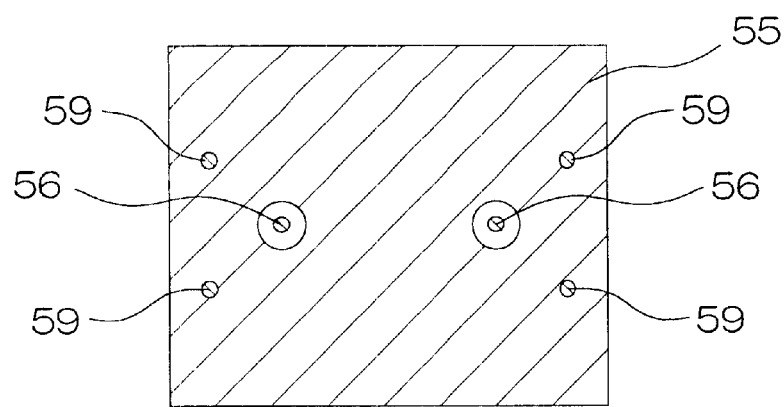
FIG. 18A is a pattern diagram of a grounding layer in the package shown in FIG. 17.
Figure 18B:
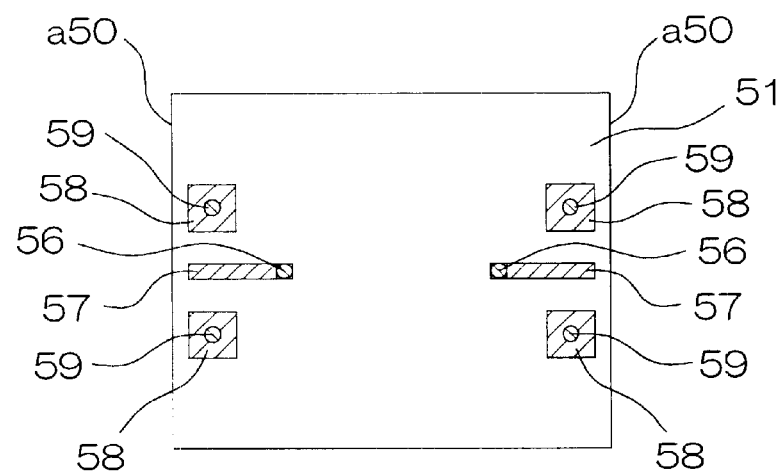
FIG. 18B is a plan view showing a surface, on the side of mounting, of a dielectric board.
Figure 18C:
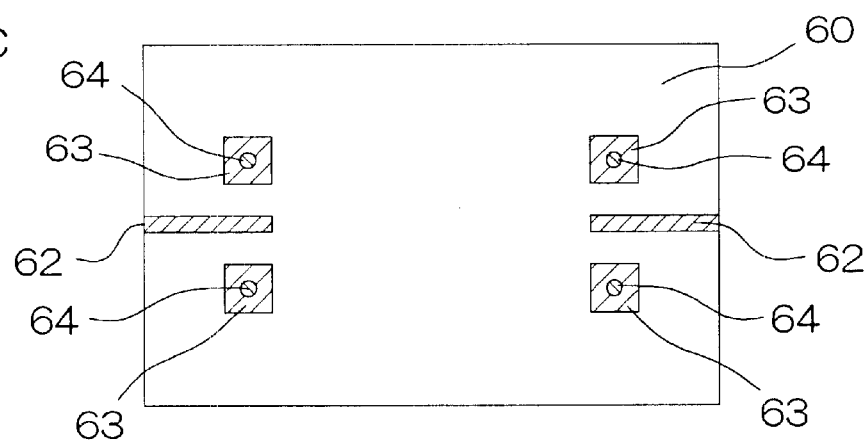
FIG. 18C is a plan view of an external circuit board on which a package is mounted.

Transmission characteristics after surface-mounting a high frequency wiring board on an external circuit board were measured. The structure of an evaluating wiring board used for the measurement is shown in FIGS. 15A and 15B. In FIGS. 15A and 15B, portions corresponding to the portions shown in FIGS. 14A and 14B are assigned the same reference numerals as those shown in FIGS. 14A and 14B.

In an evaluating wiring board 24, a signal conductor line 26, (W0) in line width, having two terminal ends was formed on a surface, on the side of mounting, of a dielectric board 25, and a grounding layer 28 was formed inside the dielectric board 25, to form a high frequency transmission line X composed of a microstrip line.

A pair of connecting grounding conductors 27 was formed on both sides of each of the terminal ends of the signal conductor line 26. The connecting grounding conductor 27 and the grounding layer 28 were electrically connected to each other by a semi-circular through conductor (viahole) 29 having a diameter of D mmφ. A connecting terminal portion Y was thus formed. Further, the ratio (W1/W0) of the line width, in the connecting terminal portion Y, of the signal conductor line 26 was changed to 0.5 or 1.0.

The position of the through conductor 29 was changed, to prepare several types of samples which differ, as shown in Table 4, in the distance T between an end side surface a of the dielectric board 25 and the through conductor 29 and a relationship n/D between the diameter D of the through conductor 29 and a distance n (see FIGS. 15 8A to 8C). The distance G between the center of the signal conductor line 26 and the through conductor 29 was set to 0.23 mm.

Except in the sample assigned the sample number 4-4, a non-grounding region 30 having its end in an approximately W shape was formed, as described in FIG. 10C, in a portion facing to the connecting terminal portion Y on the grounding layer 28.

The evaluating wiring board 24 was connected to and mounted on an external circuit board 18 having connecting terminal portions having the structures shown in FIGS. 13A and 13B through solder. With respect to the external circuit board 18 on which the evaluating wiring board 24 had been surface-mounted, signal insertion loss S21 was measured as transmission characteristics at a frequency of 30 GHz from the one connecting terminal portion on the external circuit board 18 to the other connecting terminal portion via the evaluating wiring board 24.

For the evaluating wiring board 24 and the external circuit board 18, an alumina board having a dielectric constant of 9 was used. A signal conductor line, a grounding layer, a connecting grounding conductor, and a through conductor were formed by simultaneous sintering using tungsten. Exposed surfaces of the signal conductor line and the connecting grounding conductor were gold-plated.

TABLE 4

| sample No. | distance T (mm) | $W_1/W_0$ | non-grounding region | diameter D (mm) | n (mm) | n/D | insertion loss (dB) | note |
|---|---|---|---|---|---|---|---|---|
| 4-1 | 0 | 0.5 | Yes | 0.3 | 0.15 | 0.5 | 0.9 | |
| 4-2 | 0 | 0.5 | Yes | 0.5 | 0.25 | 0.5 | 1.0 | |
| 4-3 | 0 | 0.5 | Yes | 0.7 | 0.35 | 0.5 | 2.4 | |
| 4-4 | 0 | 0.5 | No | 0.3 | 0.09 | 0.3 | 3.0 | |
| 4-5 | 0 | 1.0 | Yes | 0.3 | 0.21 | 0.7 | 2.5 | |
| *4-6 | 0.4 | 0.5 | Yes | 0.3 | — | — | 1.0 | cracked by thermal shock test |
| *4-7 | 0.8 | 0.5 | Yes | 0.3 | — | — | 6.6 | |

*mark indicates a sample in which a problem occurred.

As apparent from the results of Table 4, in the sample assigned the sample number 4-7 in which the distance T from the end side surface of the dielectric board to the through conductor was 0.8 mm, the insertion loss after the mounting was large. Further, in the sample assigned the sample number 4-6 in which the distance T was 0.4 mm, a portion between the viahole and the end side surface of the alumina board was cracked in a thermal shock test, so that long-term reliability was a problem.

Contrary to this, it was found that a part of a side surface of the through conductor was exposed to the end side surface of the alumina board, to prevent resonance between the through conductor and the end side surface of the dielectric board, and to reduce the insertion loss after the mounting.

In the sample in which the line width W1, in the connecting terminal portion, of the signal conductor line was smaller than the line width W0, in the high frequency transmission line, of the signal conductor line, the insertion loss could be made smaller than that in the sample in which W1=W0.

Furthermore, it was found that in the sample in which a non-grounding region was provided, the insertion loss could be further reduced, as compared with that in the sample assigned the sample number 4-4 in which there was no non-grounding region.

Although the present invention has been described and illustrated in detail, it is clearly understood that the same is by way of illustration and example only and is not to be taken by way of limitation, the spirit and scope of the present invention being limited only by the terms of the appended claims.

The application claims the conventional priority benefits of Japanese Patent Application Serial Nos. 11-227959, 11-227960, and 11-227961 filed with the Japanese Patent Office on Aug. 11, 1999, and No. 11-245345 filed with the Japanese Patent Office on Aug. 31, 1999, the disclosures of which are incorporated herein by reference.

What is claimed is:

1. A high frequency wiring board comprising:

a dielectric board;

a high frequency transmission line for transmitting a high frequency signal, having a signal conductor line formed on a surface of the dielectric board and a grounding layer formed inside or on a reverse surface of said dielectric board parallel to the signal conductor line, the signal conductor having its terminal end extending toward the vicinity of an end side surface of the dielectric board; and a connecting terminal portion, provided at a terminal end of said high frequency transmission line, for connection with another high frequency circuit, the connecting terminal portion including connecting grounding conductors formed with spacing on both sides of said signal conductor line on the surface of said dielectric board and through conductors penetrating said dielectric board for connecting said connecting grounding conductors and said grounding layer, the distance between said through conductors and the end side surface of said dielectric board being not more than 0.3 times the signal wavelength, in said dielectric board, of said high frequency signal; and a non-grounding region is provided in a region positioned between said paired through conductors in said grounding layer and facing to said signal conductor line.

2. The high frequency wiring board according to claim 1, wherein the distance between said through conductors and the end side surface of said dielectric board is not less than 0.05 mm.

3. The high frequency wiring board according to claim 1, wherein a side surface of said through conductor is exposed from the end side surface of said dielectric board.

4. The high frequency wiring board according to claim 1, wherein said high frequency transmission line is one through which a high frequency signal having a frequency of not less than 30 GHz is transmitted.

5. The high frequency wiring board according to claim 1, wherein the line width, in said connecting terminal portion, of the signal conductor line is smaller than the line width, in said high frequency transmission line, of the signal conductor line.

6. The high frequency wiring board according to claim 1, wherein
said connecting terminal portion is connected to the other high frequency circuit by a solder.

7. The high frequency wiring board according to claim 1, wherein
the distance between the center of said signal conductor line and said through conductors is not more than 0.25 $\lambda g$ ($\lambda g$: the signal wavelength, in said dielectric board, of said high frequency signal).

8. The high frequency wiring board according to claim 7, wherein
said high frequency transmission line is one through which a high frequency signal having a frequency of not less than 50 GHz is transmitted.

9. The high frequency wiring board according to claim 1, wherein
said through conductor is a viahole conductor formed by filling a viahole formed upon penetrating said dielectric board with metal paste and sintering the metal paste.

10. The high frequency wiring board according to claim 1, wherein
the maximum diameter of a cross section of said through conductor is not more than 0.5 mm.

11. The high frequency wiring board according to claim 1, wherein
letting Z1 be the impedance of said connecting terminal portion, and letting Z0 be the impedance of said high frequency transmission line, a relationship of $1.4\ Z0 \leq Z1 \leq 1.8\ Z0$ is satisfied.

12. The high frequency wiring board according to claim 11, wherein
letting W1 be the line width, in said connecting terminal portion, of the signal conductor line, and letting W0 be the line width, in said high frequency transmission line, of the signal conductor line, a relationship of $0.4\ W0 \leq W1 \leq 0.8\ W0$ is satisfied.

13. The high frequency wiring board according to claim 1, wherein
letting W1 be the line width, in said connecting terminal portion, of the signal conductor line, and letting W0 be the line width, in said high frequency transmission line, of the signal conductor line, a relationship of $0.4\ W0 \leq W1 \leq 0.8\ W0$ is satisfied.

14. A high frequency wiring board comprising:
a dielectric board;
a high frequency transmission line for transmitting a high frequency signal, having a signal conductor line formed on a surface of the dielectric board and a grounding layer formed inside or on a reverse surface of said dielectric board parallel to the signal conductor line, the signal conductor having its terminal end extending toward the vicinity of an end side surface of the dielectric board; and
a connecting terminal portion, provided at a terminal end of said high frequency transmission line, for connection with another high frequency circuit, the connecting terminal portion including connecting grounding conductors formed with spacing on both sides of said signal conductor line on the surface of said dielectric board and through conductors penetrating said dielectric board for connecting said connecting grounding conductors and said grounding layer,
a non-grounding region is provided in a region positioned between at least said paired through conductors in said grounding layer and facing to said signal conductor line in at least one of said first and second high frequency wiring boards.

15. A connecting structure for connecting a first high frequency wiring board and a second high frequency wiring board, wherein
each of said first and second high frequency wiring boards comprises
a dielectric board;
a high frequency transmission line for transmitting a high frequency signal, having a signal conductor line formed on a surface of the dielectric board and a grounding layer formed inside or on a reverse surface of said dielectric board parallel to the signal conductor line, the signal conductor line having its terminal end extending toward the vicinity of an end side surface of the dielectric board; and
a connecting terminal portion, provided at a terminal end of sad high frequency transmission line, for connection with another high frequency circuit, the connection terminal portion including connecting grounding conductors formed with spacing on both sides of said signal conductor line on the surface of said dielectric board and through conductors penetrating said dielectric board for connecting said connecting grounding conductors and said grounding layer,
the distance between said through conductor and the end side surface of said dielectric board being not more than 0.3 times the signal wavelength, in said dielectric board, of said high frequency signal in at least one of said first and second high frequency wiring boards,
the respective signal conductor lines and the respective pairs of connecting grounding conductors in the connecting terminal portions in said first and second high frequency wiring boards being respectively connected to each other through solders; and
a non-grounding region is provided in a region positioned between at least said paired through conductors in said grounding layer and facing to said signal conductor line in at least one of said first and second high frequency wiring boards.

16. The connecting structure according to claim 15, wherein
the distance between said through conductors and the end side surface of said dielectric board is not less than 0.05 mm in at least one of said first and second high frequency wiring boards.

17. The connecting structure according to claim 15, wherein
a side surface of said through conductor is exposed from the end side surface of said dielectric board in at least one of said first and second high frequency wiring boards.

18. The connecting structure according to claim 15, wherein
said high frequency transmission line is one through which a high frequency signal having a frequency of not less than 30 GHz is transmitted.

19. The connecting structure according to claim 15, wherein the line width, in said connecting terminal portion, of the signal conductor line is smaller than the line width, in said high frequency transmission line, of the signal conductor line in at least one of said first and second high frequency wiring boards.

20. The connecting structure according to claim 15, wherein a distance between the center of said signal conductor line and said through conductors is not more than 0.25 $\lambda g$ ($\lambda g$: the signal wavelength, in said dielectric board, of said high frequency signal) in at lest one of said first and second high frequency wiring boards.

21. The connecting structure according to claim 15, wherein said high frequency transmission line is one through which a high frequency signal having a frequency of not less than 50 GHz is transmitted.

22. The connecting structure according to claim 15, wherein said through conductor is a viahole conductor formed by filling a viahole formed upon penetrating said dielectric board with metal paste and sintering the metal paste in at least one of said first and second high frequency wiring boards.

23. The connecting structure according to claim 15, wherein the maximum diameter of a cross section of said through conductor in at least one of said first and second high frequency wiring boards is not more than 0.5 mm.

24. The connecting structure according to claim 15, wherein letting Z1 be the impedance of said connecting terminal portion, and letting Z0 be the impedance of said high frequency transmission line, a relationship of $1.4\ Z0 \leq Z1 \leq 1.8\ Z0$ is satisfied in at least one of said first and second high frequency wiring boards.

25. The connecting structure according to claim 24, wherein letting W1 be the line width, in said connecting terminal portion, of the signal conductor line, and letting W0 be the line width, in said high frequency transmission line, of the signal conductor line, a relationship of $0.4\ W0 \leq W1 \leq 0.8\ W0$ is satisfied in at least one of said first and second high frequency wiring boards.

26. The connecting structure according to claim 15, wherein letting W1 be the line width, in said connecting terminal portion, of the signal conductor line, and letting W0 be the line width, in said high frequency transmission line, of the signal conductor line, a relationship of $0.4\ W0 \leq W1 \leq 0.8\ W0$ is satisfied in at least one of said first and second high frequency wiring boards.

27. A connecting structure for connecting a first high frequency wiring board and a second high frequency wiring board, wherein each of said first and second high frequency wiring boards comprises a dielectric board;

a high frequency transmission line for transmitting a high frequency signal, having a signal conductor line formed on a surface of the dielectric board and a grounding layer formed inside or on a reverse surface of said dielectric board parallel to the signal conductor line, the signal conductor line having its terminal end extending toward the vicinity of an end side surface of the dielectric board; and a connecting terminal portion, provided at a terminal end of said high frequency transmission line, for connection with another high frequency circuit, the connecting terminal portion including connecting grounding conductors formed with spacing on both sides of said signal conductor line on the surface of said dielectric board and through conductors penetrating said dielectric board for connecting said connecting grounding conductors and said grounding layer, a non-grounding region is provided in a region positioned between at least said paired through conductors in said grounding layer and facing to said signal conductor line in at least one of said first and second high frequency wiring boards.

* * * * *